(12) United States Patent
Kigawa et al.

(10) Patent No.: US 7,557,491 B2
(45) Date of Patent: Jul. 7, 2009

(54) ELECTRONIC COMPONENT PACKAGE

(75) Inventors: Keisuke Kigawa, Nishitokyo (JP); Mitsumasa Sakurai, Nagano (JP)

(73) Assignee: Citizen Holdings Co., Ltd., Tokyo (JP)

( * ) Notice: Subject to any disclaimer, the term of this patent is extended or adjusted under 35 U.S.C. 154(b) by 158 days.

(21) Appl. No.: 11/702,157

(22) Filed: Feb. 5, 2007

(65) Prior Publication Data

US 2007/0182289 A1   Aug. 9, 2007

(30) Foreign Application Priority Data

Feb. 9, 2006   (JP)   ............... 2006-032079
Aug. 29, 2006  (JP)   ............... 2006-231926

(51) Int. Cl.
*H01L 41/08*   (2006.01)
(52) U.S. Cl. ...................................... 310/344
(58) Field of Classification Search ............... 310/344, 310/348
See application file for complete search history.

(56) References Cited

U.S. PATENT DOCUMENTS

| | | | | |
|---|---|---|---|---|
| 6,541,897 | B2 * | 4/2003 | Endoh | 310/344 |
| 6,545,392 | B2 * | 4/2003 | Kawauchi et al. | 310/344 |
| 6,960,870 | B2 * | 11/2005 | Kikushima et al. | 310/344 |
| 6,976,295 | B2 * | 12/2005 | Kikushima et al. | 29/25.35 |
| 7,279,824 | B2 * | 10/2007 | Tanaya et al. | 310/344 |
| 7,436,272 | B2 * | 10/2008 | Fujii et al. | 333/187 |
| 2004/0104643 | A1 * | 6/2004 | Kawauchi et al. | 310/344 |
| 2008/0042523 | A1 * | 2/2008 | Kuroda | 310/344 |

FOREIGN PATENT DOCUMENTS

| | | |
|---|---|---|
| JP | 2000-106515 A | 4/2000 |
| JP | 2000-223604 A | 8/2000 |
| JP | 2001-257279 A | 9/2001 |
| JP | 2002-76815 A | 3/2002 |
| JP | 2004-297344 A | 10/2004 |
| JP | 2005-16965 A | 1/2005 |
| JP | 2005-229340 A | 8/2005 |

* cited by examiner

*Primary Examiner*—Mark Budd
(74) *Attorney, Agent, or Firm*—Westerman, Hattori, Daniels & Adrian, LLP.

(57) ABSTRACT

The present invention is to prevent melted sealant from flowing into the interior of a case of an electronic component package that is provided with a shielding electrode on the inner surface of the case, fill a through-hole with the sealant with reliability, and perform vacuum airtight sealing. The electronic component package 10 has a case 12 that has an opening and stores an electronic component (piezoelectric oscillator 11) in the storage inside, and a lid 16 that is joined to the rim of the opening to cover the opening, and airtightly seals a through-hole 20 provided on the bottom part 12b of the case 12 to communicate with the outside, by using a sealant 30. The electronic component package is provided with a shielding electrode 15 on the inner surface of the case to remove a noise influence, and further provided with a configuration to set a part (nonmetal part 22) between the through-hole 20 and the shielding electrode 15, the part being low in wettability with the melted sealant 30, thereby making it difficult to flow the melted sealant 30 from the through-hole 20 into the case 12 along the shielding electrode 15, preventing the melted sealant 30 from flowing into the case 12.

9 Claims, 31 Drawing Sheets

FIG. 26A
FIG. 26B
FIG. 26C
FIG. 26D
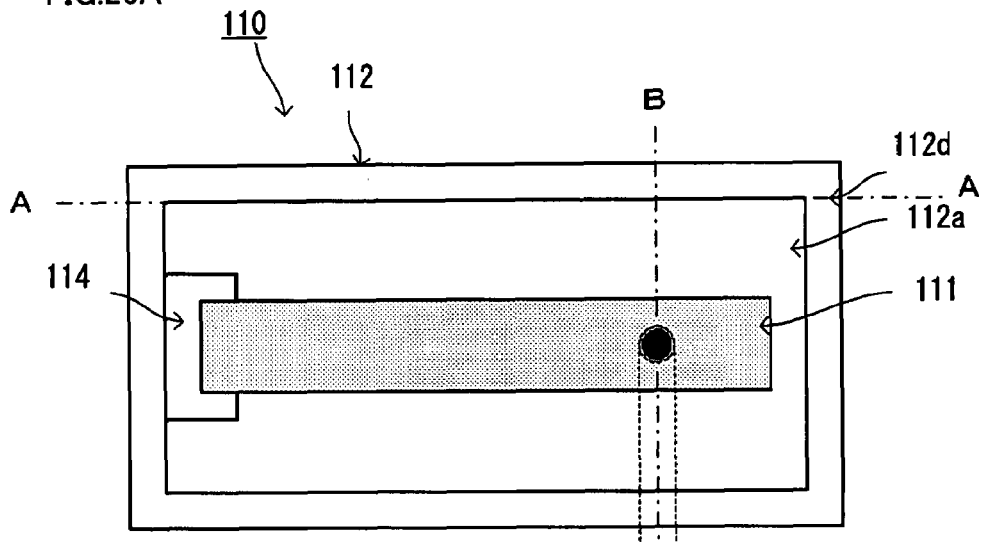
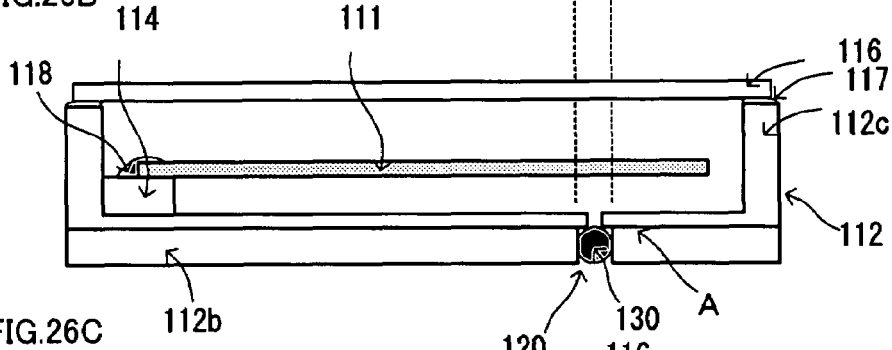
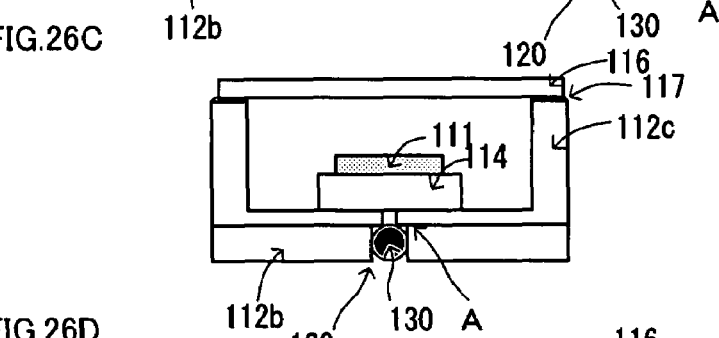
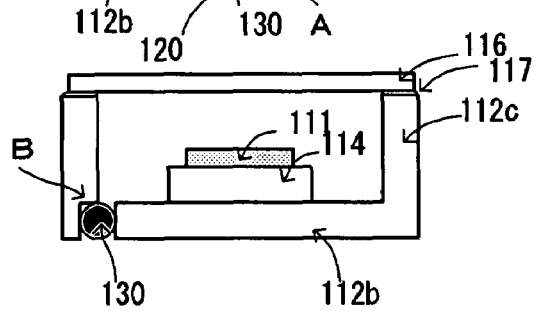

FIG.30A
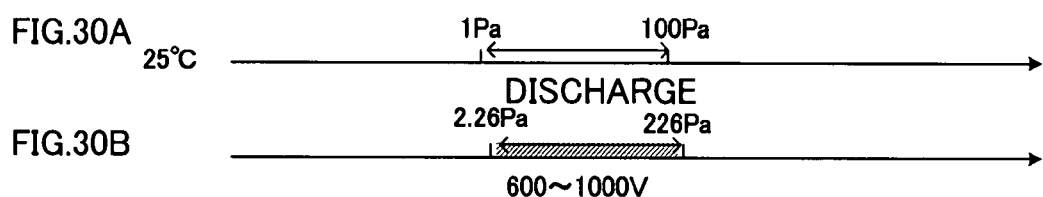
FIG.30B
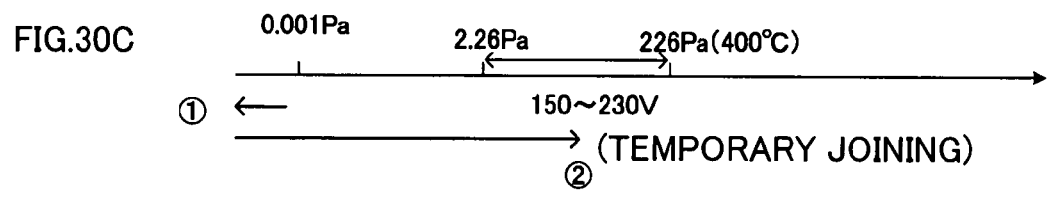
FIG.30C
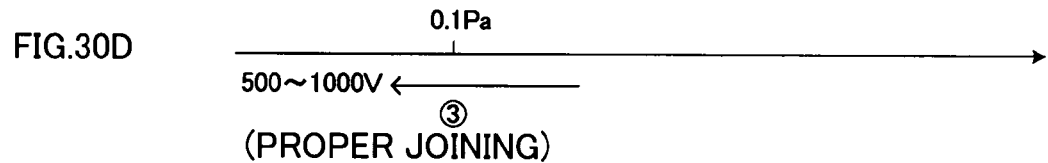
FIG.30D

ELECTRONIC COMPONENT PACKAGE

TECHNICAL FIELD

The present invention relates to an electronic component package that is obtained by storing an electronic component such as a piezoelectric oscillator including a crystal oscillator in a case made up of a substrate such as ceramics, and thereafter subjecting the case to airtight sealing with a lid. The present invention further relates to a physical sensor that employs this electronic component package.

RELATED ART

An electronic component such as a piezoelectric oscillator device is structured by storing an oscillatory element in such a manner as being airtightly sealed within a package which is made up of a case of an insulating substrate such as ceramics and a metallic lid that seals an opening of the case, for instance.

In accordance with downsizing in dimension and in thickness of an electronic product, there is a growing requirement for the electronic component such as the piezoelectric oscillator device to be further smaller and thinner in size, as well as reduced in cost, and the like.

Therefore, in recent years, there have been developed lots of surface mount devices (SMD), and it is required that the vacuum level is made higher for the airtight sealing, so as to enhance characteristics of the piezoelectric oscillator device. In addition, a piezoelectric oscillatory gyro, which employs the piezoelectric oscillator device, has been developed and put into practice use, in various fields such as a vehicle position detecting and posture control system, and a system to prevent camera shaking in using a digital camera or a digital video camera (including a camera designed for a mobile phone).

As a general method to airtightly seal a package of the piezoelectric oscillator device, there has been used conventionally, electrical furnace welding, seam welding, and electron beam machining. The electrical furnace welding is a sealing method that heats a case in a vacuum to melt a sealant and it is superior cost wise and in productivity. However, since the overall periphery of the sealant is welded all at once, there is a problem that outgas generated from the sealant upon welding is trapped in the interior of the package, thereby deteriorating the degree of vacuum.

The seam welding is a sealing method that abuts a pair of roller electrodes against the lid to feed a current therethrough, and subjects the contact portions to resistance heating to melt the sealant. Though it is superior in sealing yields, there are disadvantages as the following: An expensive seal ring is necessary as the sealant; there are limits in downsizing due to the thickness of the ring part; and it is not suitable for high-speed welding works.

The electron beam machining is a sealing method that melts a sealant by heating the lid with irradiation of electron beam. This method receives attention from a viewpoint of requirements of smaller and thinner body, but there is a problem that the cost for preparing a manufacturing system is high.

FIG. 25A, FIG. 25B, and FIG. 25C illustrate a conventional configuration example of an electronic component package such as a piezoelectric oscillator device, which is configured to store an electronic component.

In FIG. 25A, FIG. 25B, and FIG. 25C, there is shown an electronic component package 110 in which an edge of a piezoelectric oscillator 111 is fixedly attached with an adhesive agent to a support part 114 on an inner surface 112a that is surrounded by a side wall 112c of a case 112, and thereafter the case is airtightly sealed by a lid 116 with a sealant 117 placed on an end face 112d of the side wall 112c of the case 112. FIG. 25A is a front view with the lid removed, and FIG. 25B and FIG. 25C are cross sectional views.

A through-hole 120 is provided on a bottom 112b of the case 112, and the case 112 with the lid 116 attached is evacuated via this through-hole 120, thereby producing vacuum inside. After a vacuum is produced inside the case 112, a sealant 130 is placed in the through-hole 120, and this sealant 130 is heated and melted with irradiation of an electron beam, a laser beam, or the like, thereby sealing the through-hole 120 and the interior of the case 112 is maintained under vacuum.

For example, Japanese published unexamined patent applications No. 2000-106515, paragraph 0012, hereinafter referred to as "patent document 1", No. 2002-76815, paragraph 0012, hereinafter referred to as "patent document 2", No. 2004-297344, hereinafter referred to as "patent document 3", and No. 2005-229340, hereinafter referred to as "patent document 4" are known as conventional arts relating to the above mentioned electronic component package.

The patent document 1 relates to a case for piezoelectric oscillator, and it describes the discloses as the following; a metal layer formed by a high-melting point metalization is made to adhere to an inner surface of a through-hole provided in the case, and also a plated metal layer such as nickel or gold that is superior in wettability with the brazing filler serving as a sealant is made to adhere to the surface of this metal layer, and thereby the through-hole is sealed by a sealant made of a brazing filler of lead-tin alloy. In this configuration, there is a problem that a part of the sealant being melted may protrude from an upper surface and a lower surface of an insulating substrate, and consequently the sealant protruding from the upper surface of the insulating substrate comes into contact with the piezoelectric oscillator piece accommodated inside the case. Therefore, oscillation of the piezoelectric oscillator piece may be stopped or a normal vibration may be interrupted. In order to solve this problem, the through-hole is made up of a first hole on the upper surface side, and a second hole on the lower surface side that has an opening larger than the first hole, whereby, the sealant being melted is wet and expanded only around the opening of the second hole side and it does not reach the upper and lower surfaces of the insulating substrate.

The patent document 2 relates to a package structure for AT-cut piezoelectric oscillator, and it discloses a configuration having a layered structure of an upper side thin-plate member having a surface to mount the piezoelectric oscillator piece and a lower side thin-plate member having the bottom surface of the package, and a through-hole is made up of a small diameter part formed on the upper thin-plate member and a large diameter part formed on the lower thin-plate member concentrically with the small diameter part.

The patent document 3 relates to a piezoelectric device, and discloses that a base of a package is made up of a first base sheet and a second base sheet on which sealing holes are concentrically provided, the diameter of the sealing hole provided on the second base sheet is smaller than the sealing hole provided on the first base sheet, and this smaller diameter part serves as a receiving part of a sealing-use ball of brazing filler metal, whereby it is possible to prevent the ball of brazing filler metal from dropping into the interior of the package; the receiving part is formed as a part of a frame member and the sealing hole is provided at a position away from excitation electrodes of the piezoelectric oscillator piece, whereby it is possible to reduce an influence of splash that occurs when the ball of brazing filler metal is melted; and a metal film is provided on a wall surface of the sealing hole, allowing the sealant to favorably adhere to the wall surface, thereby preventing the sealant from running into the package.

The patent document 4 relates to a case for a piezoelectric oscillator, and it discloses a configuration in which a position to form a through-hole is to be where a side wall of the case is formed and it is formed in a stepped shape, thereby preventing a sealant such as metallic ball from dropping into a bottom plate of the case.

FIG. 26A to FIG. 26D show an overview of the through-hole having a two-layer structure that is formed on the bottom of the case. Here, FIG. 26A is a front view, FIGS. 26B and 26C are cross sectional views. FIG. 26D shows a configuration in which a part of the frame member forms the receiving part for the ball of brazing filler metal.

The bottom of the case 112 has two-layer structure, and stepped part "A" with different diameters is formed at the through-hole 120 part, and this stepped part "A" prevents the sealant 130 from dropping into the interior of the case 112, and also prevents the sealant 130 being melted from running into the case 112.

In the meantime, when the sealant 130 is placed in the stepped part "A" of the through-hole 120, the case 112 is reversed upside down from the orientation as shown in FIG. 26B. Then, the bottom 112b of the case 112 is set to face upward, and the sealant 130 such as the ball of brazing filler metal is put in the though-hole 120, allowing the stepped part "A" to hold the sealant.

In FIG. 26D, the wall part 112c and a part of the bottom part 112b of the case, which constitute the frame member, form the stepped part "B", and this stepped part "B" holds the sealant 130.

Hereinafter, with reference to FIG. 27A to FIG. 27C and FIG. 28, a method for manufacturing the oscillator device according to conventional arts will be explained (for example, see Japanese published unexamined patent applications No. 2001-257279, page 3, FIG. 2, and FIG. 3, hereinafter referred to as "patent document 5", No. 2000-223604, pages 3 to 4, FIG. 1, hereinafter referred to as "patent document 6", and No. 2005-16965, pages 6 to 7, FIG. 2, hereinafter referred to as "patent document 7").

The patent documents 5, 6, and the like disclose package 100 for an oscillator device made up of a case 112 and a lid 116, and when the lid 116 is welded on the upper face of a side wall of the case 112, weld sealing is carried out by using an electron beam in the state of high vacuum.

FIG. 27A and FIG. 27B show that the lid 116 (FIG. 27A) is placed via a sealant (not illustrated) on the upper surface of the side wall of the case 112 in which the oscillator 111 is installed (FIG. 27B). FIG. 27C illustrates that an electron beam 108 is irradiated from the upper side of the lid 116 to melt the sealant, thereby conducting the weld sealing.

When the vacuum level in the package 100 is lowered, an equivalent series resistance of the crystal oscillator (referred to as "CI value") becomes larger, and consequently, there occurs a problem that frequency characteristics are deteriorated and a stable oscillation is disabled. Therefore, it is necessary to perform the welding operation in the state of high degree of vacuum. In view of the situation above, in order to reduce residual gas and enhance the degree of vacuum within the package 100, the weld sealing is divided into two-times operations, and at the time of first welding, the gas generated from the sealant is exhausted, and thereafter the second welding is performed.

Furthermore, there is disclosed a manufacturing method in which the case and the lid are joined by anode joining (for example, refer to the patent document 3). FIG. 28 shows a configuration according to the example above. There is disclosed a manufacturing method in which the pressure within the chamber 230 is regulated, and a support substrate 242 (glass) and a sealing substrate 241 (silicon) are joined by the anode joining.

In this example here, the support substrate 242 and the sealing substrate 241 are placed on a hot stage 250 within the chamber 230, and the pressure within the chamber 230 is regulated to a predetermined level. Under this condition, a voltage from a power source 260 is applied to the support substrate 242 and the sealing substrate 241 to execute the anode joining, whereby the support substrate 242 and the sealing substrate 241 are joined.

It is further disclosed that after the support substrate and the sealing substrate are joined, the gas within the package is exhausted through an opening provided on the bottom of the support substrate, and thereafter, the opening is sealed by a sealant. The patent documents 4 and 5 also disclose a configuration that conducts evacuation through the opening provided on the bottom and airtightly seals the package by sealing the opening with the sealant.

SUMMARY OF THE INVENTION

As described above, in order to address the problems such as dropping a sealant into the interior of a case or flowing of the sealant being melted into the case, there has been proposed a configuration in which the bottom of the case has a two-layer structure to provide a through-hole with a stepped part. However, there are problems that the two-layer structure renders the configuration complicated, and therefore, the cost is increased. In addition, this configuration makes it difficult to render the case small in thickness.

Furthermore, an electronic component package such as a piezoelectric oscillator device or the like, which has an electronic component sealed inside, is applied to various industrial products such as a vehicle position detecting and posture control system, a digital camera, a digital video camera, and a mobile phone. When applied to those industrial products, it is general that the electronic component package is used in such a manner as being mounted together with other electronic components that constitute the product. An IC and high resistor electronic components on the circuit board tend to pick up a noise from the outside, and if an influence is exerted by the noise, it may cause a false operation.

Generally, there is known a method to reduce such influence of noise, that is, providing a shielding electrode and connecting the electrode with a ground electrode.

In the electronic component package, a noise may occur from a piezoelectric oscillator piece stored inside the case or the electrode installed on the piezoelectric oscillator at the time of starting up, and it may cause an adverse effect on the IC and the high resistance electronic components on the circuit board that is provided in a product in which the electronic component package is mounted.

FIG. 29A to FIG. 29D illustrate an influence by the noise, and a state of the sealant in the case where the shielding electrode is provided. In FIG. 29A, the electronic component package 110 is mounted on the circuit board 150. Under this condition, if the piezoelectric oscillator 111 stored inside the case 112 of the electronic component package 110 generates a noise at the time of starting up, the noise passes through the bottom part or the wall part of the case 112 made of an insulating material, and makes an intrusion into the electronic components mounted on the circuit board 150 side. On the other hand, when a noise occurs in the circuit mounted on the circuit board 150 side, there is a possibility the noise passes through the bottom part or the wall part of the case 112 made of the insulating material and makes an intrusion into the piezoelectric oscillator 111 or surrounding electrode stored in the case 112.

FIG. 29B illustrates a situation where a shielding electrode 115 is provided on the inner surface 112a of the case 112 of the electronic component package 111. A metal layer such as nickel-based gold, which is superior in wettability with the sealant, is made to adhere by plating to the inner surface 120a of the through-hole 120. Therefore, this creates a situation that metal layers are made to adhere continuously from the inner surface 112a of the case 112 to the inner surface 120a of the through-hole 120.

When the through-hole 120 of the case 112 on which the shielding electrode 115 is provided is sealed by using the sealant 130, there is a possibility that the sealant 131 heated and melted by electron beam irradiation, laser beam irradiation, or the like, flows into the case 112 along the shielding electrode 115 from the inside of the through-hole 120. FIG. 29C and FIG. 29D schematically illustrate a state of the sealant 131 that has flown into the inside of the case 112. FIG. 29C shows a state that the sealant 131 flows onto the shielding electrode 115 on the outer circumference of the through-hole 120, and FIG. 29D shows a state that the sealant 131 flows onto the shielding electrode 115 from one side of the through-hole 120.

As described above, when the sealant 131 flows into the inside of the case 112 along the shielding electrode 115, it is not possible to fill the through-hole with the sealant with reliability. Consequently, there occurs a problem that the piezoelectric oscillator piece 111 stored inside the case 112 cannot be subjected to vacuum-tight sealing. Furthermore, a part of the sealant being melted may protrude from the upper surface of the shielding electrode 115 that is provided on the inner surface 112a of the case 112. Consequently, the sealant 131 protruding from the upper surface of the shielding electrode 115 comes into contact with the piezoelectric oscillator piece 111 stored inside the case 112, and this may cause a problem such as stopping the oscillation of the piezoelectric oscillator piece 111 and preventing a normal vibration.

In view of those problems above, a first object of the present invention is to address a conventional problem, to prevent a flow of the melted sealant into the interior of a case of an electronic component package that is provided with a shielding electrode on the inner surface of the case.

With the method for manufacturing an oscillator device as disclosed by the patent documents 5 and 6, since the crystal oscillator is subjected to airtight sealing in the high vacuum state so as to seal the package, a CI value of the crystal oscillator can be made small. Therefore, the frequency characteristics are improved and a stable oscillation can be achieved.

However, in the oscillator device manufactured by the conventional manufacturing method, though the stable oscillation can be performed with the small CI value, Q value is increased, and there is a problem that it takes a long time until the crystal oscillator starts a stable drive. Here, the Q value indicates a volume representing how sharp is a resonance curve, and the larger is this volume, the sharper is the resonance curve.

In addition, if the oscillator device manufactured by the conventional manufacturing method is used in a physical sensor such as an oscillatory gyro sensor or an oscillatory acceleration sensor, a stable oscillation can be obtained by making the CI value smaller, whereas the Q value becomes higher, resulting in that the time until the crystal oscillator starts a stable drive becomes longer. Consequently, there is a problem that it is not possible to reduce the time length (starting time) that is required until a stable waveform is detected from the crystal oscillator.

In the method for manufacturing the oscillator device as disclosed by the patent documents 5 and 6, it is described that the first welding and the second welding are performed by using the electron beam welding or the laser beam welding. Since the electron beam welding cannot be performed with a visual checking as a matter of course, accurate positioning for welding by using a precision instrument is required, and therefore the works are time consuming.

As for the laser beam welding, welding with a high speed scanning is required if an area to be welded is large as in the first welding, considering a necessity of a short-time working. However, it is not possible to perform welding operation with a high speed scanning due to a characteristic of the laser beam. Therefore, there is no other way but a low speed scanning in order to perform the welding operation with reliability, and therefore, the welding operation cannot be carried out within a short time, causing a problem such as damaging the member and generating outgas.

Furthermore, according to the method for manufacturing a package as disclosed by the patent document 7, it is found that the Q value of the oscillatory gyro and a temperature coefficient are balanced favorably, by regulating the pressure within the chamber to a range from 1.0 to 100 Pa (patent document 7, paragraph 0047). This is opposed to the conventional idea that it is desirable to make the interior of the chamber to be a high vacuum state to reduce a dumping effect of the oscillator and enhance the Q value. On the basis the findings above, a pressure within the chamber is regulated to a predetermined level instead of the high vacuum state.

Since this predetermined pressure range overlaps a pressure range at which a discharge occurs when anode joining is performed, the patent document 7 discloses that joining is performed in two steps, a temporary joining and a proper joining, and the pressure and the applied voltage are different between the two steps. FIG. 30A to FIG. 30D illustrate conditions in the above situation. FIG. 30A shows an internal pressure condition of the package, FIG. 30B shows a condition where a discharge occurs in the anode joining, and FIG. 30C and FIG. 30D show a pressure condition and an applied voltage condition in each of the temporary joining and the proper joining.

Since the internal pressure condition of the package overlaps the pressure condition at the discharge occurrence in anode joining (FIG. 30A and FIG. 30B), the pressure is firstly set to 0.001 Pa or less, and then set to 2.26 Pa to 226 Pa. Under this pressure condition, the temporary joining is performed at a low voltage (150 to 230 V). Next, the pressure is set to 0.1 Pa or less and the proper joining is performed at a high voltage from 500 to 1,000 V.

In any of the cited documents, characteristics of the oscillator are evaluated based on the Q value. Therefore, even if the Q value has successfully been regulated to be within a desired range, there is a problem that it does not necessarily indicate that the CI value of the oscillator sealed in this package is regulated to be within a desired range. There is a further problem that a balance between a detection sensitivity behavior and a starting characteristic of the oscillator placed within the package is not necessarily regulated favorably.

In the patent document 3, the pressure within the chamber is also regulated to be a predetermined level. However, this pressure regulation aims at making the Q value to be within a predetermined range, and it is not clearly defined how it is regulated to the desired pressure level after the proper joining is performed at 0.1 Pa or less.

It is to be noted here that the detection sensitivity behavior of the oscillator is based on a size of a detected signal due to a mechanical change, and the starting characteristic of the oscillator is based on a starting time that is required until the detected signal detected from the oscillator becomes stable.

The detection sensitivity behavior and the starting characteristic can be evaluated by a vibration characteristic when the oscillator is vibrated, and this vibration characteristic is represented by the CI value of the oscillator.

Therefore, the present invention has been made to address the problems in the conventional arts, and the second object of the present invention is to enhance the detection sensitivity behavior and the starting characteristic of the oscillator in an oscillator package that is prepared by sealing an electronic component such as oscillator within a package, and in a physical sensor that includes the oscillator package.

In order to achieve the first object, an electronic component package according to the present invention includes a case that has an opening and stores an electronic component in a storage inside, a lid that covers the opening, being joined to a rim of the opening, and airtightly seals a through-hole by using a sealant, the through-hole being provided on a bottom of the case and communicating with the outside, wherein, a shielding electrode is provided on an inner surface of the case so as to remove an effect of noise, and a part is provided between the through-hole and the shielding electrode, the part being low in wettability with the sealant being melted, thereby reducing a tendency of flowing the sealant being melted into the case from the through-hole along the shielding electrode and preventing the sealant being melted from flowing into the interior of the case.

The configuration of the part between the through-hole and the shielding electrode, the part reducing the wettability with the sealant being melted, corresponds to a configuration to provide a nonmetal part for preventing the inflow of the sealant, between the shielding electrode placed on the inner surface of the case and a metal coating placed on the inner surface of the through-hole that communicates with the outside.

Usually, as the sealant, brazing filler made of metal is used, such as gold-tin alloy and gold-germanium alloy, for example, which does not contain lead. By applying the metal coating on the inner surface of the through-hole, the wettability with the brazing filler is rendered favorable, thereby enhancing adhesivity.

In sealing the electronic component according to the present invention, the nonmetal part provided between the through-hole and the shielding electrode has a low wettability with the sealant made of the brazing filler metal. Therefore, even if the sealant melted from the through-hole tries to flow toward the interior of the case, this nonmetal part reduces flowability and suppresses the inflow, and further prevents the sealant from going over this nonmetal part and flowing into the shielding electrode provided on the inner surface of the case.

There are multiple examples as to the configuration of this nonmetal part provided in the electronic component package according to the present invention, which is prepared for preventing the inflow of the sealant.

A first example is directed to an electronic component package that is made of an insulating material, and a shielding electrode is provided on the inner surface of the case, excluding a circular part having an inner periphery corresponding to the rim of through-hole on the inner surface of the case side. An exposed surface of the case in this circular area forms the nonmetal part.

This first example makes use of the insulating property of the case of the electronic component package. When the shielding electrode is set on the inner surface of the case, it is placed in such a manner as excluding a circular part having the inner periphery corresponding to the rim of the through-hole on the inner surface of the case side, and the nonmetal part can be formed just by placing the shielding electrode in this manner.

In a second example, similar to the first example, the case of the electronic component package is made of an insulating material, and a metal coating is provided on the inner surface of the through-hole, excluding a circular area as a part of the through-hole in the axial direction, and an exposed surface of the inner surface of the through-hole in this circular area forms the nonmetal part.

This second example makes use of the insulating property of the case of the electronic component package. When the metal coating is set to the inner surface of the through-hole, it is applied in such a manner as excluding the circular area as a part in the axial direction of the through-hole, and the nonmetal part can be formed just by applying the metal coating in this manner.

In a third example, the nonmetal part is formed by providing a circular body made of an insulating member on the shielding electrode, in such a manner as surrounding the through-hole on the inner surface of the case side.

The third example makes use of the circular insulating member, and the nonmetal part can be formed only by arranging this circular member having the insulating property on the shielding electrode in such a manner as surrounding the through-hole.

In a fourth example, the nonmetal part is formed by a cylindrical part made of an insulating member, which circularly covers at least a part of the inner periphery surface in the axial direction of the through-hole, and the cylindrical part has an inner diameter equal to that of the through-hole.

The fourth example makes use of the insulating member of the cylindrical part, and the nonmetal part can be formed only by fitting and inserting this insulating cylindrical part into the through-hole.

A fifth example is directed to a combination of the above mentioned third example and the fourth example, and the nonmetal part is formed by the circular member made of the insulating member surrounding the through-hole on the shielding electrode provided on the inner surface of the case, and the cylindrical part made of the insulating member that circularly covers at least a part of the inner surface in the axial direction of the through-hole.

This fifth example makes use of the insulating member of the cylindrical part, and the nonmetal part can be formed only by attaching this insulating cylindrical part into the through-hole part.

In a sixth example, the case of the electronic component package is made of an insulating material, and the through-hole is formed to have a corn-like shape with a tilted cross section at least up to the midway in the axial direction of the through-hole from the rim of the through-hole on the inner surface of the case side. On the inner surface of this through-hole, a metal coating is provided on the inner periphery surface excluding a circular area as a part of the axial direction of the through-hole, and the nonmetal part is formed by an exposed surface in this circular area of the inner periphery surface of the through-hole.

This sixth example makes use of an insulating property of the case of the electronic component package, and the non-metal part can be formed only by setting a part to form the metal coating, that is, the metal coating is applied in such a manner as excluding the circular area as a part of the axial direction of the through-hole, when the metal coating is applied on the inner periphery surface of the through-hole.

According to an aspect of the present invention, a piezoelectric oscillator as an electronic component is provided in the electronic component package, thereby constituting a physical sensor to detect a physical quantity that is applied from the outside. This physical sensor can be utilized as an oscillatory type gyro sensor.

In order to achieve the second object, a method for manufacturing an oscillator package according to an aspect of the present invention is to manufacture the oscillator package that has a case having an opening and storing an oscillator in a storage inside, and a lid that covers the opening, being joined to a rim of the opening, and to seal by a sealant a through-hole provided in a bottom of the case to establish communication between the storage and the outside, and subjects the oscillator package to airtightly sealing within a sealing chamber, including a primary welding step to weld the rim of the case to the lid, a step to place the sealant in the through-hole, a sealing chamber internal pressure control step that controls the pressure within the sealing chamber to a predetermined level, and a secondary welding step that melts the sealant by a laser beam irradiation and seals the through-hole under a condition that a pressure in the sealing chamber is set to the predetermined level. In this secondary welding step, the predetermined pressure level is determined based on a vibration characteristic of the oscillator.

In the step to seal the case storing the oscillator inside, the sealing chamber internal pressure control step allows the sealing chamber to communicate with inside the case of the oscillator package, and under this condition, the vibration characteristic of the oscillator stored within the sealing chamber is obtained. Then, the pressure within the sealing chamber is regulated in order to make the vibration characteristic to have a predetermined property. By regulating the pressure within the sealing chamber to a predetermined level, the pressure inside the case that is communicating with inside the sealing chamber is regulated to a predetermined level.

In the secondary welding step, the through-hole provided on the case is sealed by melting the sealant under the condition that the pressure inside the case is regulated to a predetermined level, thereby maintaining the pressure inside the case to be the predetermined level. By regulating the pressure within the chamber to the predetermined level when the secondary welding step is performed, it is possible to control a crystal impedance value to be within a given range, thereby achieving a favorable balance between a drive performance and a starting characteristic. Therefore, it is possible to manufacture an electronic component package in which the oscillator has the drive performance and the starting characteristic in good condition.

For example, this sealant is a ball of brazing filler metal, and this sealant is melted by irradiating a laser beam thereon. According to an aspect of the present invention, in melting the sealant by irradiating the laser beam, the inside of the sealing chamber is made to be an atmosphere of nitrogen gas that is introduced at a constant pressure, whereby the temperature around the through-hole can be lowered by a radiation effect. Consequently, generation of crack due to an occurrence of thermal storage around the sealed through-hole is prevented, and an occurrence of leak from the substrate can be suppressed. Since the radiation effect cannot be obtained in the conventional high-vacuum state, the heat is stored and it causes a rise in temperature, and this may be a factor to a crack generation.

Furthermore, in the conventional high-vacuum state, since the radiation effect cannot be obtained, an area surrounding a tray on which a large number of oscillators are arranged is overheated, and then gas is generated, causing a change of the pressure within the sealing chamber from a desired pressure level, and this may exert an influence upon the crystal impedance value management.

According to an aspect of the present invention, when a large number of packages are manufactured within the sealing chamber, the laser is continuously irradiated onto the large number of packages arranged on the tray, thereby melting the sealant placed in the through-hole. In this occasion, the inside of the sealing chamber is made to be an atmosphere of nitrogen gas that is introduced with a constant pressure, whereby it is possible to control a rise in temperature on the tray by a radiation effect. Consequently, it is possible to suppress outgas that is generated by the overheating the area around the tray, thereby facilitating the management of the crystal impedance value of the oscillators.

The sealing chamber internal pressure control step according to the present invention includes a measuring step that measures the vibration characteristic of the oscillator, and the sealing chamber internal pressure value is controlled in order to make the vibration characteristic value obtained by this measuring step to be within a predetermined range. When the pressure within the sealing chamber is changed, the vibration characteristic value of the oscillator placed within the package is also changed. By reflecting the vibration characteristic measured in the measuring step on the pressure regulation, the pressure within the package is set to be a pressure at which a desired vibration characteristic can be obtained.

The oscillator may be a crystal oscillator. In this occasion, the vibration characteristic value is a crystal impedance value (CI value) in a driven vibration of the oscillator.

It is generally known that an equivalent circuit of an oscillator can be represented by equivalent circuit constants for four elements L, C1, R, and C0 as shown in FIG. 31. "C1" represents a series capacitance between electrodes provided on the oscillator, and the CI value corresponds to "R". If "f" is assumed as a resonance frequency of the oscillator, the relationship between the CI value and the equivalent circuit constants are expressed by;

$$CI = 1/(C1 \cdot 2pf \cdot Q)$$

Since this crystal impedance value depends on various conditions such as a wafer to form the crystal oscillator, etching to form the oscillator, and a form of a drive electrode film, there is a variation in this crystal impedance value lot by lot to form the crystal oscillator, even with the same specification.

According to the manufacturing method of the present invention, in the measuring step, a drive signal is applied from the outside to allow the oscillator to oscillate, and the crystal impedance value can be obtained by measuring a resonant resistance in a resonance frequency of the oscillator being oscillated. The drive signal is a signal such as a current or an electric power, which causes the oscillation of the oscillator.

In addition, the sealing chamber internal pressure step according to an aspect of the invention includes a step to perform vacuum pumping to make the pressure within the sealing chamber to be lower than a target pressure value to render inside a high vacuum state, and a step to perform a flow control and introducing of nitrogen or inactive gas during the vacuum pumping. In the vacuum pumping step, the inside of the sealing chamber is rendered high vacuum state to a certain level, and thereafter, the vacuum pumping is performed while introducing the nitrogen or inactive gas. In introducing this nitrogen or inactive gas, the pressure within the sealing chamber is regulated by controlling the gas flow rate being introduced. According to the configuration as described above, it is possible to regulate the pressure within the sealing chamber to a desired pressure level, and in addition, since the oscillator is sealed within the nitrogen gas or noble gas, impure substances may not adhere to the oscillator. Therefore, it is useful for preventing deterioration, enabling a long-life nature.

As to the oscillator sealed in the package by the manufacturing method according to an aspect of the present invention, it is possible to measure the crystal impedance value of the oscillator while controlling the internal pressure of the sealing chamber lot by lot of the oscillator, unlike the conventional arts, and thus an optimum pressure within the package can be determined. Therefore, a yield in the sealing process can be drastically improved, and when a physical sensor is configured based on this method, a balance between the detection sensitivity behavior and the starting characteristic can be enhanced.

The manufacturing method further includes a step to perform vacuum pumping of the sealing chamber, and anneal treatment step to heat the case and the lid in the vacuum state, between the step to place the sealant and the sealing chamber inner pressure control step. In the anneal treatment step, impure substances and volatile substances within the package are exhausted from the through-hole into the sealing chamber, and further, it can be exhausted to the outside of the sealing chamber by the vacuum pumping.

In addition, by forming the through-hole on the bottom in the opposite side of the lid of the case, a sealing position in the secondary welding step can be precisely set, and as a result, sealing failure, i.e., leakage failure is resolved.

According to the electronic component package of the present invention, it is possible to prevent a sealant being melted from entering the case of the electronic component package with a shielding electrode provided on the inner surface of the case. In other words, since the inside of the through-hole can be filled up with the sealant with reliability, a yield of the vacuum tight sealing is dramatically improved.

According to the manufacturing method of the present invention, it is possible to provide a method for manufacturing an oscillator package that is favorable in detection sensitivity behavior and the starting characteristic of the oscillator. In addition, workability in weld sealing the oscillator package is favorable, and a highly precise physical sensor can be provided, which reduces the starting time that is required until the detection signal from the oscillator becomes stable.

BRIEF DESCRIPTION OF THE DRAWINGS

FIG. 26A to FIG. 26D are illustrations schematically showing a through-hole having two-layer structure provided on the bottom of a case;

FIG. 30A to FIG. 30D are illustrations to explain a pressure range when anode joining is performed.

DETAILED DESCRIPTION OF THE INVENTION

Hereinafter, the electronic component package according to the present invention will be explained in detail with reference to the accompanying drawings.

Figure 1:
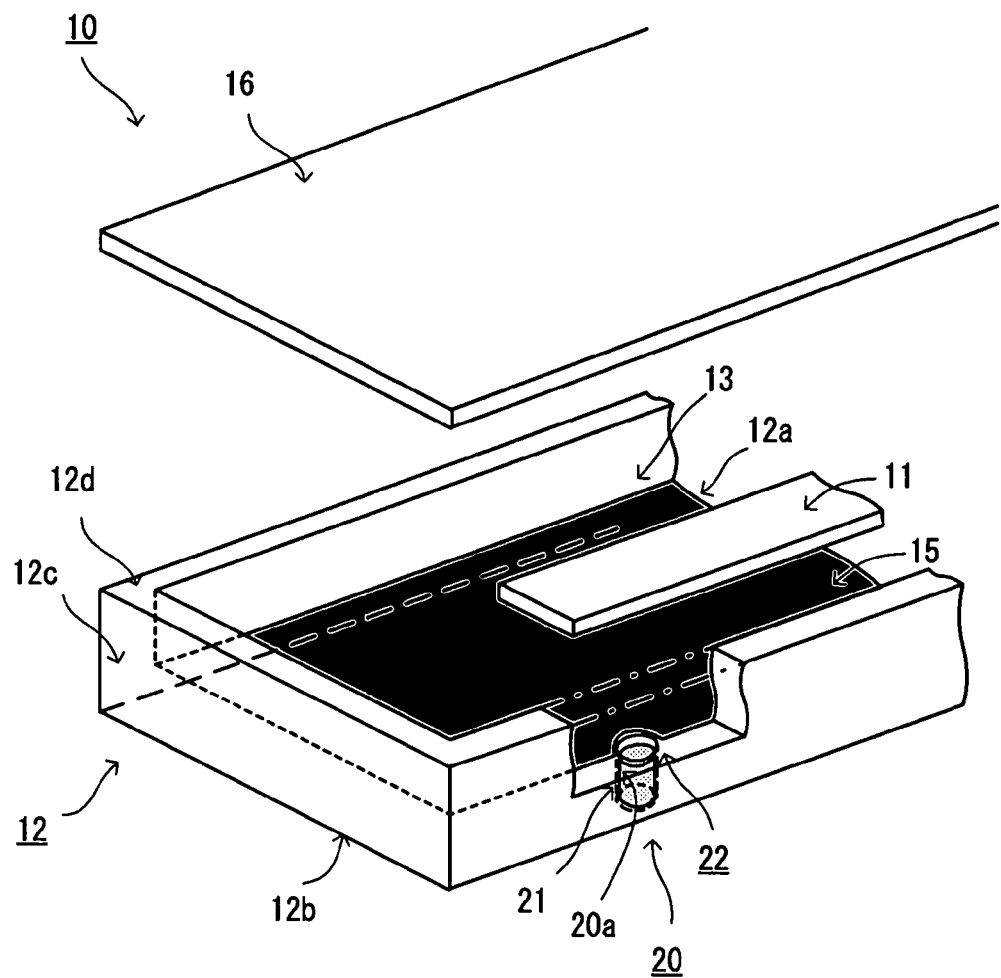
FIG. 1 illustrates a schematic configuration of an electronic component package according to an aspect of the present invention.

FIG. 1 illustrates a schematic configuration to explain the electronic component package according to an aspect of the present invention. In FIG. 1, the electronic component package 10 includes a case 12 that has an opening and stores in a storage 13 an electronic component such as a piezoelectric oscillator 11, and a lid 16 that is joined to the rim of the opening to cover the opening.

The case 12 is provided with an inner surface 12a that supports an edge of the piezoelectric oscillator 11 by a support part 14 (not illustrated in FIG. 1) to store the oscillator, a side wall 12c that surrounds the periphery of the inner surface 12a, and a bottom part 12b that closes the opposite side of the opening end of the side wall 12c. The inner surface 12a and the sidewall 12c forms a space corresponding to the storage part 13 that stores the piezoelectric oscillator 11 therein. After the lid 16 that is placed on the upper end face 12d of the sidewall 12c, the space of this storage 13 is closed by using a sealant, thereby maintaining airtight condition inside.

The bottom part 12b of the case 12 is provided with a through-hole 20 that communicates the space of the storage 13 with the outside of the case 12. After the piezoelectric oscillator 11 is placed in the storage 13 and the lid 16 is attached thereon, the through-hole 20 serves as an air vent that exhausts gas inside the storage 13, so as to make the inside of the storage 13 to be at predetermined pressure level, or to remove a gaseous substance discharged from the sealant or the like.

After the pressure inside of the storage 13 becomes a predetermined level, a sealant is inserted into this through-hole 20, and a laser beam or the like is irradiated to melt the sealant, thereby sealing the storage airtightly.

The through-hole 20 is a communication hole that communicates the outside of the case 12 with the inside thereof (space of the storage 13) at the bottom part 12 of the case 12, and there is provided a metal coating 21 on the inner surface 20a of the through-hole 20. This metal coating 21 is made of a metal layer obtained by a high melting point metalizing or the like, and the metal layer being nickel-based and gold-plated on the surface, which is superior in wettability with the brazing filler of the sealant, is made to adhere to the surface. This configuration enhances airtightness in sealing the through-hole by the sealant made of a brazing filler metal such as gold-tin alloy and gold-germanium alloy.

In addition, it is possible that a part of the through-hole 20 is positioned at the inner surface 12a of the case 12, and the other part is positioned at a part of the side wall 12c. By positioning a part of the through-hole 20 at a part of the side wall 12c, the through-hole 20 is formed with a stepped part, and this stepped part prevents the ball of brazing filler metal being the sealant before melted, from dropping into the interior of the case 12 through the through-hole 20, as well as reducing an influence that a splash generated at the time of melting the ball of brazing filler metal may adhere to the piezoelectric oscillator 11.

In addition, the inner surface 12a of the case 12 is provided with a shielding electrode 15 that reduces a noise leaking from the piezoelectric oscillator 11 being driven, to an IC and high resistance electronic components on a circuit board that is provided outside the electronic component package 10. This shielding electrode 15 is provided on the inner surface 12a of the case 12, almost entirely excluding the part corresponding to the through-hole 20, and it is connected to a ground potential.

The electronic component package 10 according to an aspect of the present invention is characteristically provided with a nonmetal part 22, which forms a flow prevention part that prevents the sealant being melted in the through-hole 20 (not illustrated in FIG. 1) from flowing into the interior of the case 12, along the shielding electrode 15.

The nonmetal part 22 is provided between the shielding electrode 15 placed on the inner surface 12a in the case 12, and the through-hole 20. More specifically, the nonmetal part 22 is provided between the shielding electrode 15 and the metal coating 21 provided on the inner periphery surface 20a of the through-hole 20. When the sealant is melted and introduced into the through-hole 20, and adheres to the inner periphery surface 20a of the through-hole 20, thereby sealing the through-hole 20, the nonmetal part 22 stops moving of the sealant at the position of or just before the nonmetal part 22, and prevents the sealant from flowing into the interior of the case 12, by utilizing a property that the nonmetal part is low in wettability with the melted sealant.

Therefore, the sealant melted in the through-hole 20 stops at the position of the metal coating 21 provided on the inner surface 20a of the through-hole 20, without flowing into the internal space of the case 12, and favorably seals the through-hole 20.

Figure 2A:
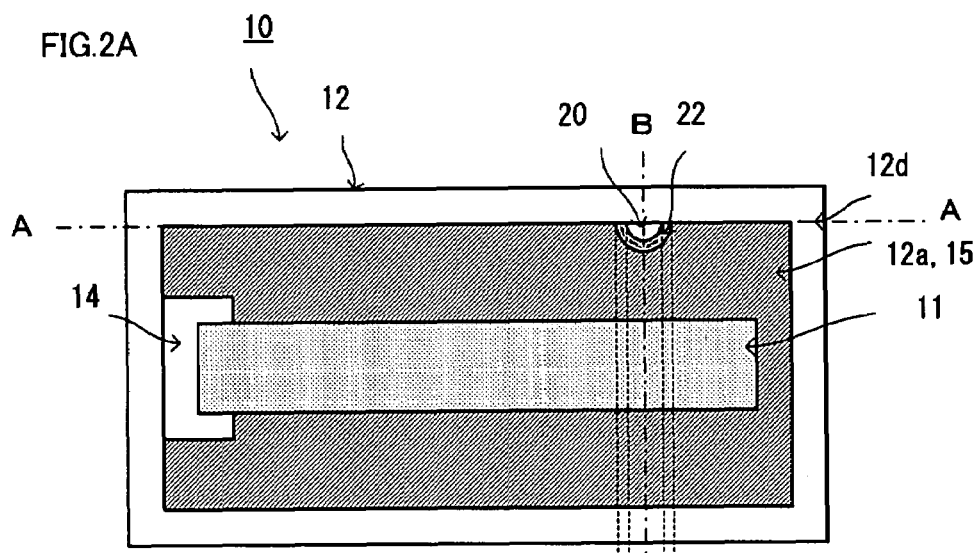
FIG. 2A is a front view and FIG. 2B and FIG. 2C are cross sectional views, each showing a first configuration example of a nonmetal part that is provided in the electronic component package according to an aspect of the present invention.
Figure 2B:
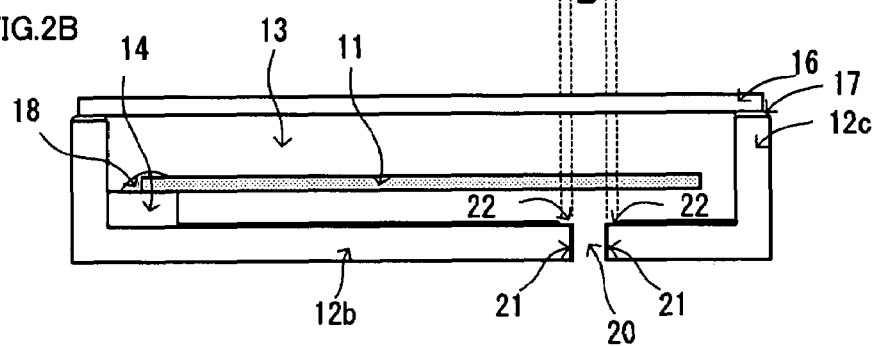
Figure 2C:
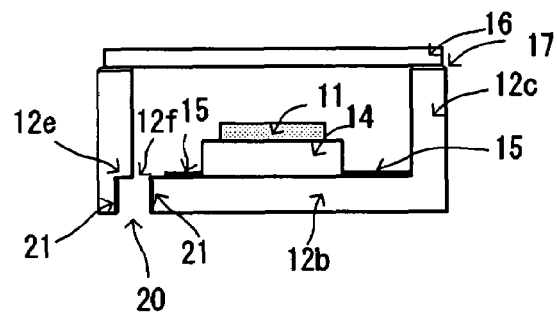

FIG. 2A shows a front view of the electronic component package according to the present invention, in the state where the lid is removed. FIG. 2B and FIG. 2C respectively illustrate cross sectional views, viewed from different sections.

The through-hole 20 is formed in such a manner that a part thereof is positioned on the bottom part 12b of the case 12, and a part of the remainder is at a position that is lower part of the side wall upper face 12d, at a height almost the same as the bottom part 12b. According to the configuration above, an offset part 12e is formed at the lower part of the side wall upper end face 12d where a stepped part is made by the through-hole 20. At the offset part 12e, the through-hole 20 communicates with the space inside the case 12 via the opening 12f.

On a part of the through-hole 20, mainly the part of the through-hole on the inner surface 12a of the case 12 side, there is provided a flow prevention part that prevents the sealant melted in the through-hole 20 (not illustrated in FIG. 2) from flowing into the interior of the case 12. This flow prevention part can be made up by the nonmetal part 22, which is provided between the shielding electrode 15 placed on the inner surface 12a within the case 12 and the through-hole 20, more particularly, between the shielding electrode 15 and the metal coating 21 placed on the inner periphery surface 20a of the through-hole 20a.

The storage 13 of the case 12 has a sealant 17 between the side wall upper end face 12d and the lid 16, then the sealant 17 is heated by irradiating a beam, irradiation with a lamp, or an electrical furnace (not illustrated) and melted for adhesion, thereby sealing the storage 13 by the lid 16. In the state where the lid 16 is attached, the storage 13 inside the case 12 is rendered vacuum, by exhausting the air in the case 12 by an exhaust system such as an exhaust chamber and vacuum pump (not illustrated). After exhausting the air from the storage 13 and setting the inside to a predetermined pressure level, a sealant is placed within the through-hole, and this through-hole 20 is sealed by heated and melted with an irradiation of laser beam onto the sealant, thereby maintaining the inside of the case 12 at a predetermined pressure level. Since the sealant placed in the through-hole 20 is micro in volume, a gas quantity generated upon melting is extremely small. Therefore, it is possible to airtightly seal the case 12 with the same pressure atmosphere as the pressure within the sealing working chamber.

It is to be noted that the piezoelectric oscillator 11 is attached, in such a manner that one edge of the piezoelectric oscillator 11 is fixed with an adhesive agent 18 on the support part 14 placed on the inner surface 12a. After the piezoelectric oscillator 11 is fixed, the case 12 is closed by the lid 16, and the air inside is exhausted via the through-hole 20, rendering inside a predetermined pressure level, and then, the through-hole 20 is sealed by the sealant.

Next, with reference to FIG. 3A to FIG. 11D, a configuration examples of the nonmetal part 22 will be explained, which constitutes the flow prevention part in the electronic component package according to an aspect of the present invention.

Figure 3A:
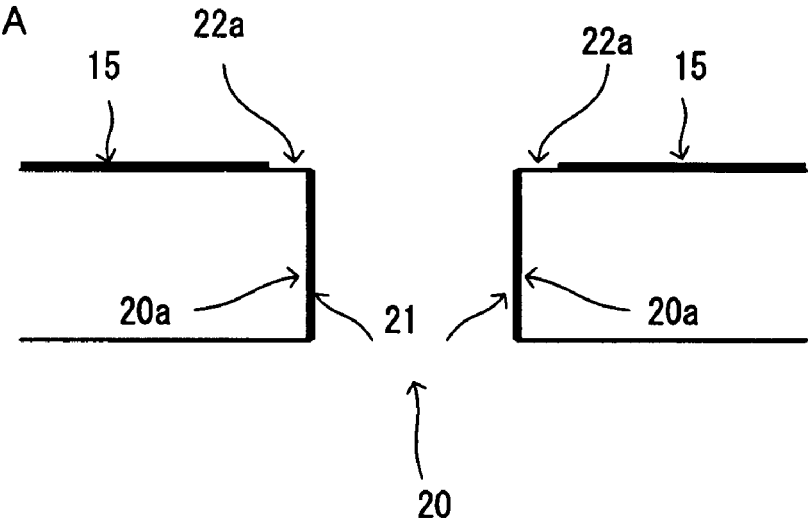
FIG. 3A and FIG. 3B are cross sectional views and FIG. 3C is a partial perspective view each showing a first configuration example of the nonmetal part that is provided in the electronic component package according to an aspect of the present invention.
Figure 3B:
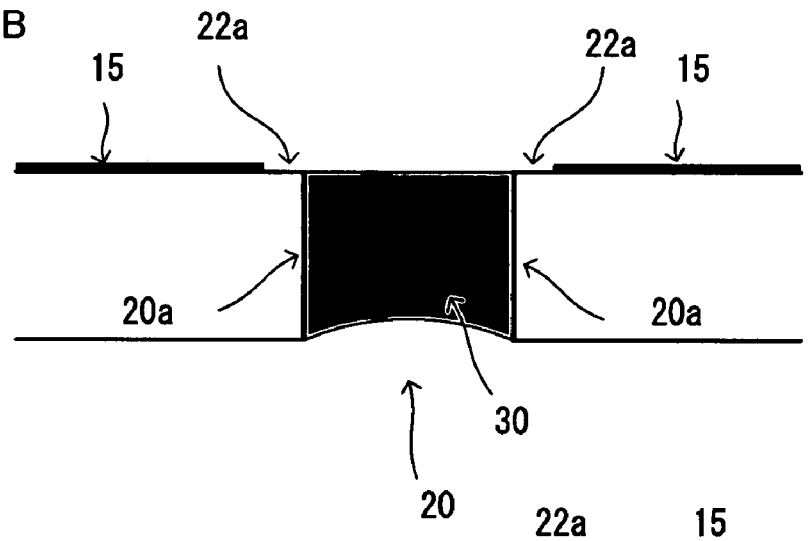
Figure 3C:
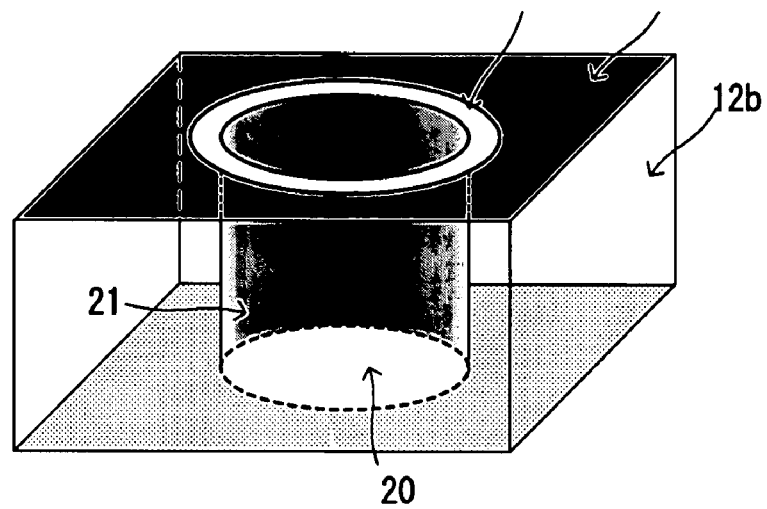

FIG. 3A, FIG. 3B, and FIG. 3C are cross sectional views and a partial perspective view showing the first configuration example of the nonmetal part that is provided in the electronic component package according to an aspect of the present invention. FIG. 3A and FIG. 3C illustrate a state before sealed by a sealant, and FIG. 3B illustrates a sealed state by the sealant.

The through-hole 20 is a communication hole that communicates the inside and the outside of the case, on the bottom part 12b of the case 12. On the inner periphery surface 20a of this hole, there is provided a metal coating 21 made of the metal layer being nickel-based with gold-plated on the surface, which is superior in wettability with a brazing filler as the sealant 30, for better adhesion thereof. In addition, there is provided a shielding electrode 15 on the inner surface of the case 12. The shielding electrode 15 can be placed by plating, coating or the like. The nonmetal part 22 constituting the flow prevention part of the present invention can be formed on the inner surface 12a by exposing an insulating material, as it is, which constitutes the case 12, without providing this shielding electrode 15.

The part of the case 12, at which the insulating material is to be exposed may be a circular body 22a that surrounds the through-hole 20, assuming the rim of the through-hole as an inner periphery, on the inner surface 12a of the case 12. Therefore, this circular body 22a is formed on the inner surface 12a of the case 12, by the insulating member on which the shielding electrode 15 is not placed. It is to be noted here that the ring width or the outer diameter of the circular body 22a may be arbitrarily determined according to a flowability of the melted sealant 30 or a quantity or the like of the sealant 30, within the width range so that the melted sealant 30 does not go over the ring part of the circular body 22a.

Figure 4A:
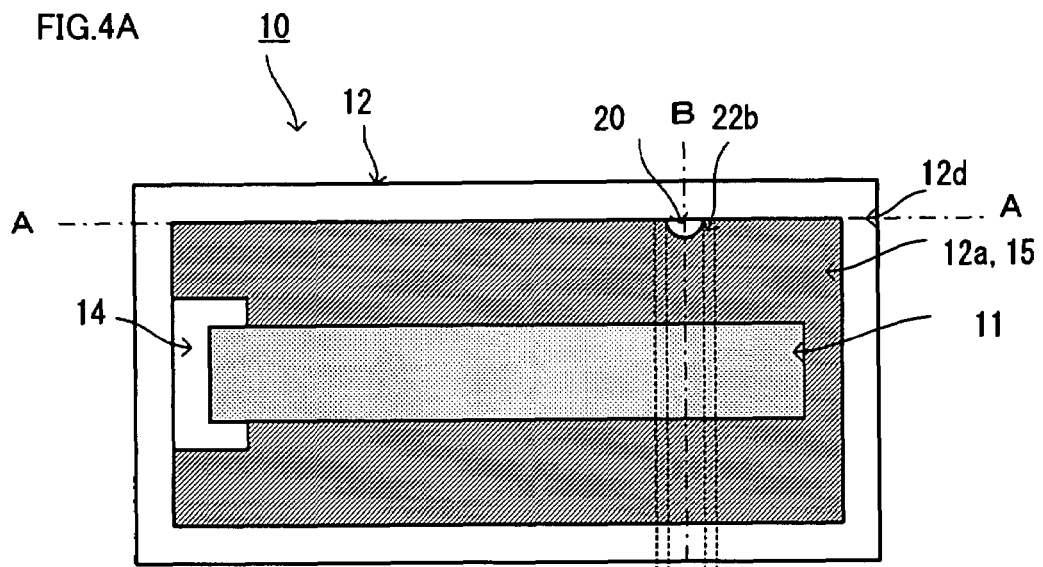
FIG. 4A is a front view and FIG. 4B and FIG. 4C are cross sectional views, each showing a second configuration example of the nonmetal part that is provided in the electronic component package according to an aspect of the present invention.
Figure 4B:
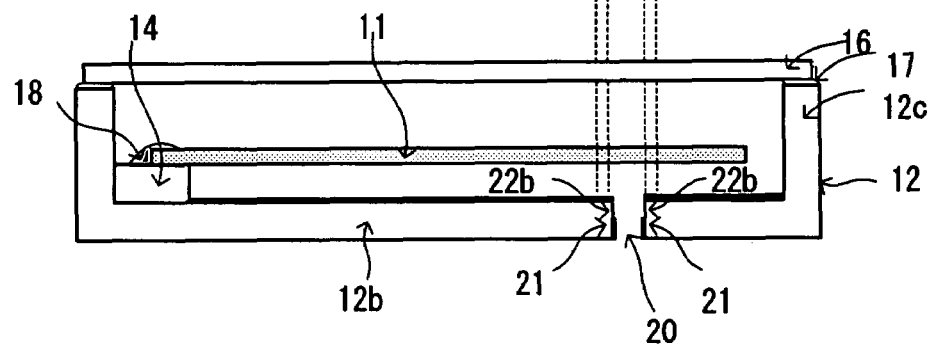
Figure 4C:
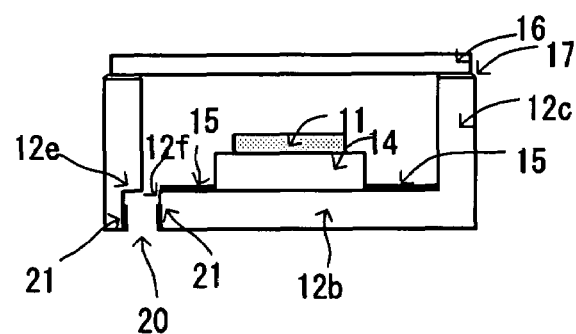

FIG. 4A, FIG. 4B, and FIG. 4C are a front view and cross sectional views showing the second configuration example of the nonmetal part provided in the electronic component package according to an aspect of the present invention.

FIG. 4A, FIG. 4B, and FIG. 4C may be the same respectively with FIG. 2A, FIG. 2B, and FIG. 2C, except the configuration of the flow prevention part. In the second configuration example as shown in FIG. 4A, FIG. 4B, and FIG. 4C, the shielding electrode 15 placed on the inner surface 12a of the case 12 is provided overall of the inner surface 12a excluding the hole of the through-hole 20, without setting the circular insulating part that surrounds the through-hole 20, which is shown in the first configuration example.

In the second configuration, the nonmetal part 22 constituting the flow prevention part is provided on the inner periphery surface of the through-hole 20.

Figure 5A:
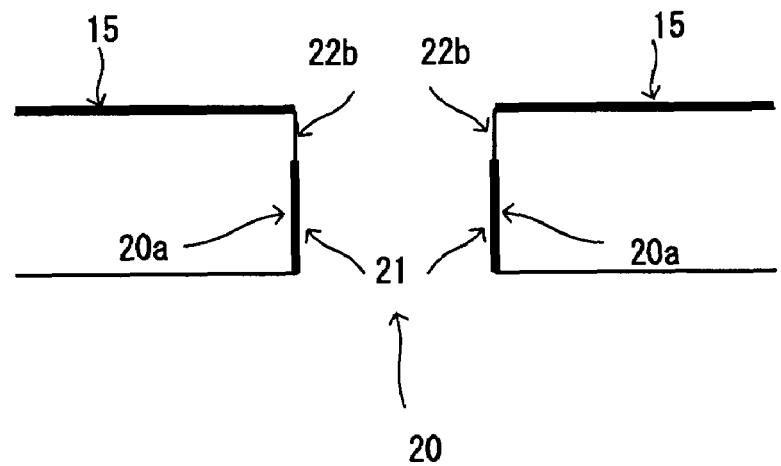
FIG. 5A and FIG. 5B are cross sectional views and FIG. 5C is a partial perspective view each showing the second configuration example of the nonmetal part that is provided in the electronic component package according to an aspect of the present invention.
Figure 5B:
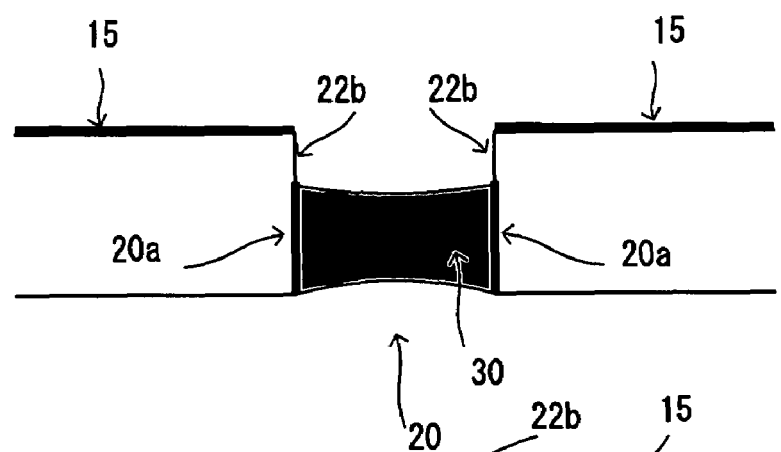
Figure 5C:
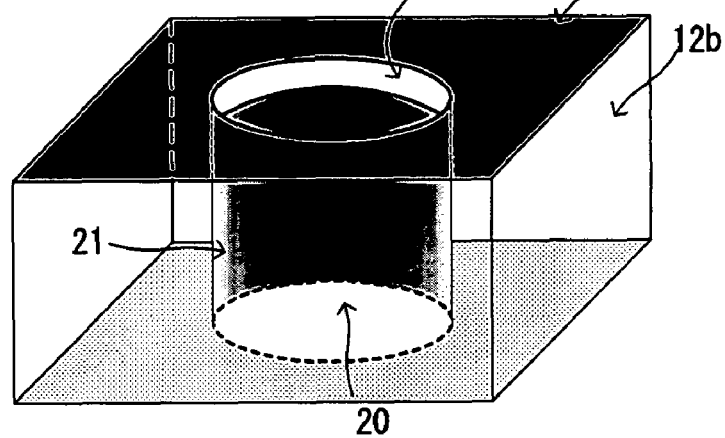

FIG. 5A, FIG. 5B, and FIG. 5C are cross sectional views and a partial perspective view showing the second configuration example of the nonmetal part that is provided in the electronic component package according to an aspect of the present invention. FIG. 5A and FIG. 5C illustrate a state before sealed by a sealant, and FIG. 5B illustrates a sealed state by the sealant.

The through-hole 20 is a communication hole that communicates the inside and the outside of the case, on the bottom part 12b of the case 12. On the inner periphery surface 20a of this hole, there is provided a metal coating 21 made of a metal layer being nickel-based with gold-plated on the surface, which is superior in wettability with a brazing filler as the sealant 30 for better adhesion thereof. In addition, a shielding electrode 15 is provided on the inner surface of the case 12. The shielding electrode 15 can be placed by plating, coating or the like.

The nonmetal part 22 constituting the flow prevention part of the present invention can be formed by a circular area 22b, which is obtained by exposing an insulating material as it is, which constitutes the case 12, without providing the metal coating 21 on a part of the inner periphery surface 20a of the through-hole 20.

On the inner periphery surface 20a of the through-hole 20, as a part in the axial direction of the through-hole 20, the metal coating 21 is provided on the inner periphery surface 20a excluding the circular area 22b, and as for this remaining circular part, the insulating member of the case 22 is exposed. The nonmetal part 22b is formed at this part where the insulating material is exposed.

In FIG. 5A, FIG. 5B, and FIG. 5C, the shielding electrode 15 is provided up to the rim of the through-hole 20, and the metal coating 21 is provided up to the midway directing to the inner surface 12a of the case 12 in the axial direction of the through-hole 20. A circular part continuing to the rim of the through-hole 20 is exposed, thereby forming the nonmetal part 22b. However, the configuration of the nonmetal part 22b is not necessarily as described above, and it is sufficient that there is formed a nonmetal part made up of an insulating part between the shielding electrode 15 and the metal coating 21. For instance, the nonmetal part may be formed by extending the shielding electrode 15 from the rim of the through-hole 20 into axial direction. In the case above, on the inner periphery surface 20a of the through-hole 20, the metal coating 21 is provided at a distance corresponding to a predetermined length in the axial direction, from the end of the shielding electrode 15 extending from the rim of the through-hole 20 in the axial direction.

Therefore, this circular body 22b is formed on the inner periphery surface 20a of the through-hole 20, by the insulating member provided between the shielding electrode 15 and the metal coating. It is to be noted here that the ring width (length in the axial direction) of the circular body 22b may be arbitrarily determined according to a flowability of the melted sealant 30 or a quantity or the like of the sealant 30, within the width range so that the melted sealant 30 does not go over the ring part of the circular body 22b.

Figure 6A:
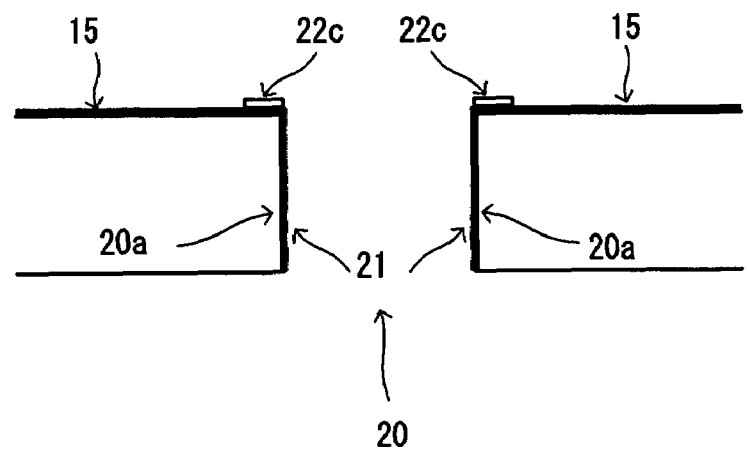
FIG. 6A and FIG. 6B are cross sectional views and FIG. 6C is a partial perspective view each showing a third configuration example of the nonmetal part that is provided in the electronic component package according to an aspect of the present invention.
Figure 6B:
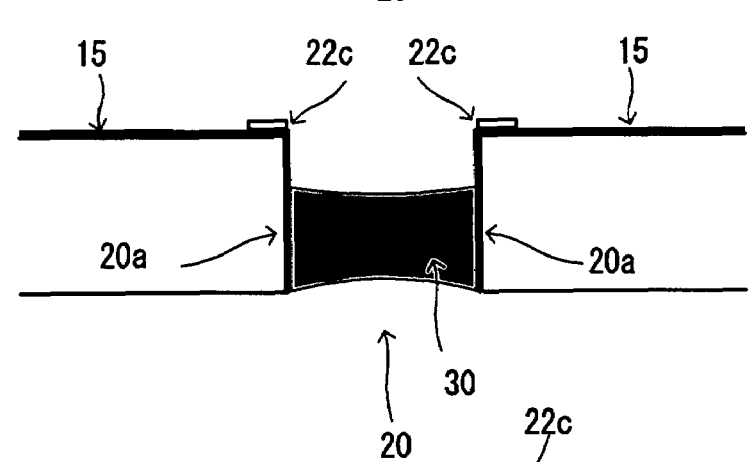
Figure 6C:
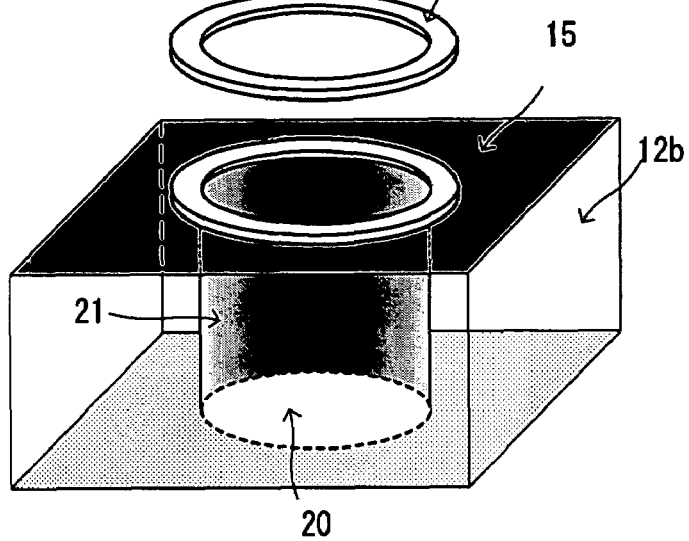

FIG. 6A, FIG. 6B, and FIG. 6C are cross sectional views and a partial perspective view showing the third configuration example of the nonmetal part that is provided in the electronic component package according to an aspect of the present invention. FIG. 6A and FIG. 6C illustrate a state before sealed by a sealant, and FIG. 6B illustrates a sealed state by the sealant.

Similar to the first and second configuration examples as described above, the through-hole 20 is a communication hole that communicates the inside and the outside of the case, on the bottom part 12b of the case 12, and a metal coating 21 is provided on the inner surface 20a of this hole. On the inner surface of the case 12, there is provided a shielding electrode 15.

Here, the shielding electrode 15 and the metal coating 21 may be continuously formed at the rim of the through-hole 20 inside the case. Alternatively, it may be configured such that the shielding electrode 15 and the metal coating 21 are formed with a distance therebetween, and the insulating member of the case 12 is exposed.

The nonmetal part 22 that constitutes the flow prevention part according to an aspect of the present invention is attached to the upper surface of the shielding electrode 15 provided on the inner surface 12a of the case 12, in such a manner as surrounding the opening of the through-hole 20 on the case inner side and mounting thereon the nonmetal circular body 22c made of an insulating member and the like. The circular body 22c is mounted on the shielding electrode 15, for example, with an adhesive agent.

The outer diameter of the circular body 22c forms a circular area that constitutes the flow prevention part, utilizing a width between the outer and inner diameters of the circular body 22c. The width of the circular area may be arbitrarily determined according to a flowability of the melted sealant 30 or a quantity or the like of the sealant 30, within the width range so that the melted sealant 30 does not go over the ring part of the circular body 22c. It is to be noted that the outer diameter of the circular body 22c is determined by the aforementioned width of the circular area and the inner diameter of the circular body 22c, since a difference between the outer and inner diameters of the circular body 22c decides the width of the circular area.

In addition, the inner diameter of the circular body 22c is approximately the same as the inside rim of the through-hole 20 of the case 12, but the diameter may be smaller than the rim of the through-hole. FIG. 6A to FIG. 6C show the example that the inner diameter of the circular body 22c is the same as the inside rim of the through-hole 20 of the case 12. In the occasion above, the sealant 30 being melted in the through-hole 20 comes into contact with the inner diameter part of the circular body 22c on the rim inside the case 12, and flowing of the sealant into the interior is stopped, by a plane of the circular body that covers from this inner diameter part to the outer diameter part.

If the inner diameter of the circular body 22c is made smaller than the diameter of the rim of the through-hole, the inner periphery of the circular body 22c is placed at a position protruding towards the center of the through-hole 20 at almost the same height of the inner surface 12a of the case 12. Therefore, this reduces the diameter of the through-hole 20. In this occasion, the sealant 30 being melted in the through-hole 20 comes into contact with a part of the circular body 22c, which protrudes inside the through-hole 20, and flowing of the sealant into the interior is stopped at this part protruding inside the through-hole, and further by the plane of the circular body that covers the inner diameter part and the outer diameter part of the circular body 22c.

On the other hand, if the inner diameter of the circular body 22c is made larger than the diameter of the rim of the through-hole, the inner periphery of the circular body 22c is placed at a position to go towards the outside from the center of the through-hole 20 at almost the same height of the inner surface 12a of the case 12. In the occasion above, the sealant 30 being melted in the through-hole 20 firstly flows into the case 12 along the shielding electrode 15 on the inner side than the inner diameter of the circular body 22c, and then, comes into contact with the inner diameter part of the circular body 22c. Therefore, the circular body plane covering from this contact part to the outer diameter part of the circular body 22c stops the inflow of the sealant. If the shielding electrode 15 part is large in width, the inflow of the melted sealant into the case may increase. However, as far as an influence by the inflow of the melted sealant into the case is within an allowable range, the inner diameter of the circular body 22c may be configured to be larger than the rim diameter of the through-hole.

Figure 7A:
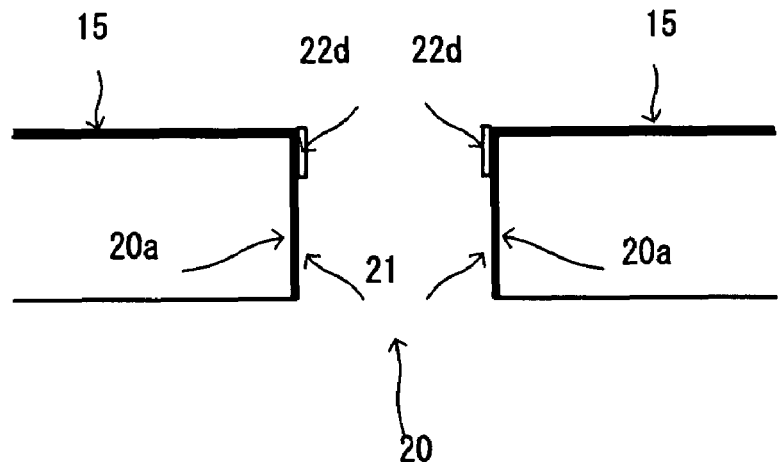
FIG. 7A and FIG. 7B are cross sectional views and FIG. 7C is a partial perspective view each showing a fourth configuration example of the nonmetal part that is provided in the electronic component package according to an aspect of the present invention.
Figure 7B:
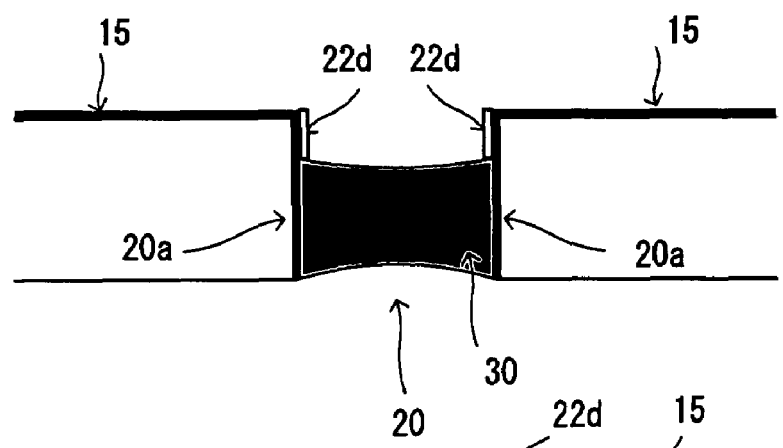
Figure 7C:
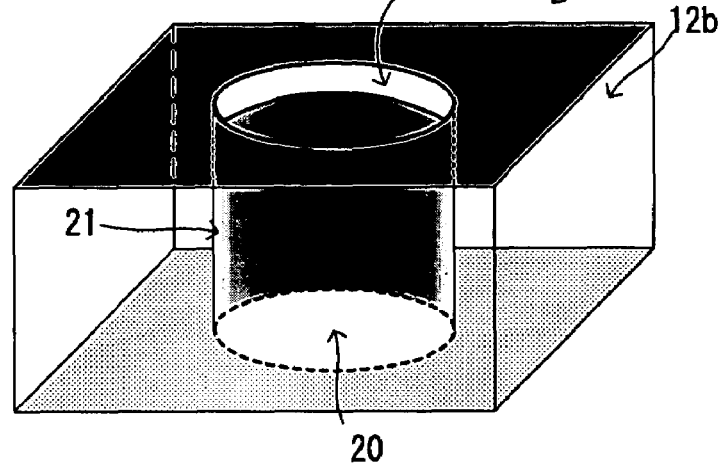

FIG. 7A, FIG. 7B, and FIG. 7C are cross sectional views and a partial perspective view showing the fourth configuration example of the nonmetal part that is provided in the electronic component package according to an aspect of the present invention. FIG. 7A and FIG. 7C illustrate a state before sealed by a sealant, and FIG. 7B illustrates a sealed state by the sealant.

Similar to the first to the third configuration examples as described above, in the fourth configuration as shown in FIG. 7A to FIG. 7C, the through-hole 20 is a communication hole that communicates the inside and the outside, on the bottom part 12b of the case 12, and a metal coating 21 is provided on the inner surface 20a of this hole. In addition, a shielding electrode 15 is provided on the inner surface of the case 12.

Here, similar to the above described third configuration example, the shielding electrode 15 and the metal coating 21 may be continuously formed on the rim of the through-hole 20 inside the case. It is further possible to configure such that the shielding electrode 15 and the metal coating 21 are formed with a space therebetween, and the insulating member of the case 12 is exposed.

The nonmetal part 22 constituting the flow prevention part according to an aspect of the present invention has the outer diameter a little smaller than the inner diameter of the through-hole 20. The nonmetal part 22 is formed by a cylindrical body 22d made up of an insulating member that circularly covering a part of the inner periphery surface 20a, which is at least a part of the through-hole 20 in the axial direction, and mounted on the metal coating 21 that is provided on the inner periphery surface of the through-hole 20. The cylindrical body 22d is mounted on the metal coating 21, for example, with an adhesive agent.

The length in the axial direction of the cylindrical body 22d is set to be shorter than at least the length of the through-hole 20 in the axial direction. On the inner periphery surface 20a of the through-hole 20, the length of the metal coating 21 in the axial direction to achieve a favorable adhesion to the sealant, corresponds to a length obtained by subtracting the length of the cylindrical body 22*d* in the axial direction mounted in the through-hole 20 from the length of the through-hole 20 in the axial direction. Therefore, the length of the cylindrical body 22*d* in the axial direction is determined, considering the length in the axial direction of the through-hole 20 (thickness of the bottom of the case), the length of the metal coating 21 in the axial direction, which is necessary for adhesion of the sealant, and the length of the insulating part that is necessary for preventing the inflow of the sealant being melted.

The cylindrical body 22*d* set within the through-hole 20 prevents the sealant 30 melted in the through-hole 20 from moving in the axial direction, thereby stopping the flowing of the sealant into the case.

Figure 8A:
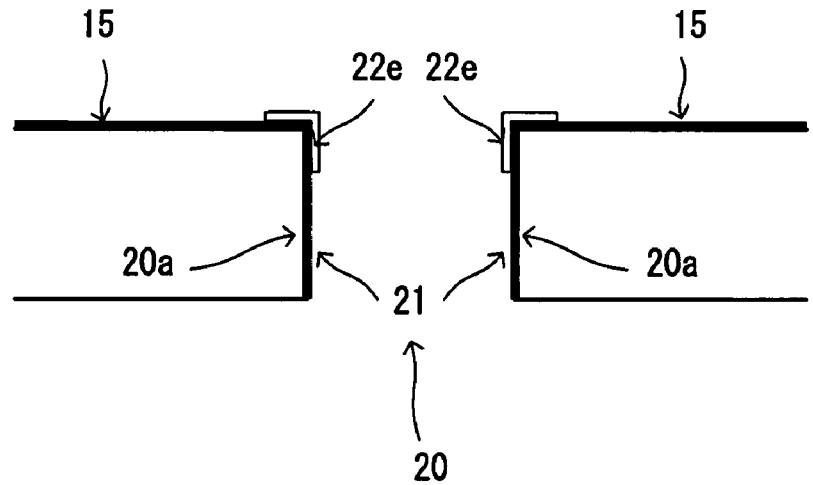
FIG. 8A and FIG. 8B are cross sectional views and FIG. 8C is a partial perspective view each showing a fifth configuration example of the nonmetal part that is provided in the electronic component package according to an aspect of the present invention.
Figure 8B:
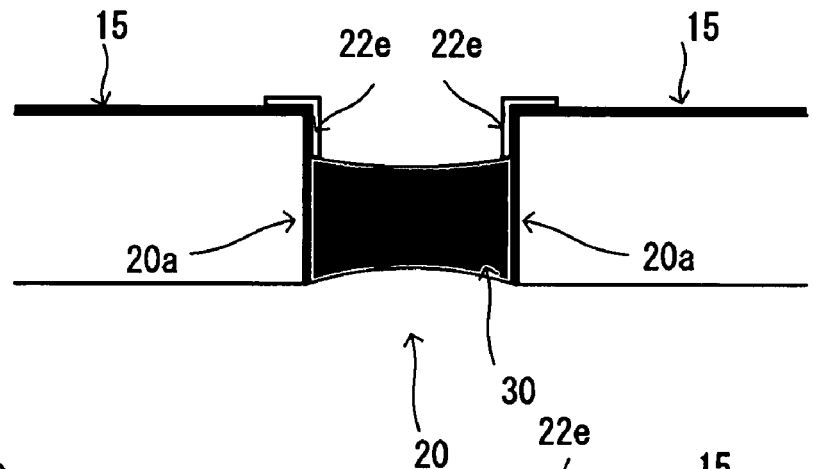
Figure 8C:
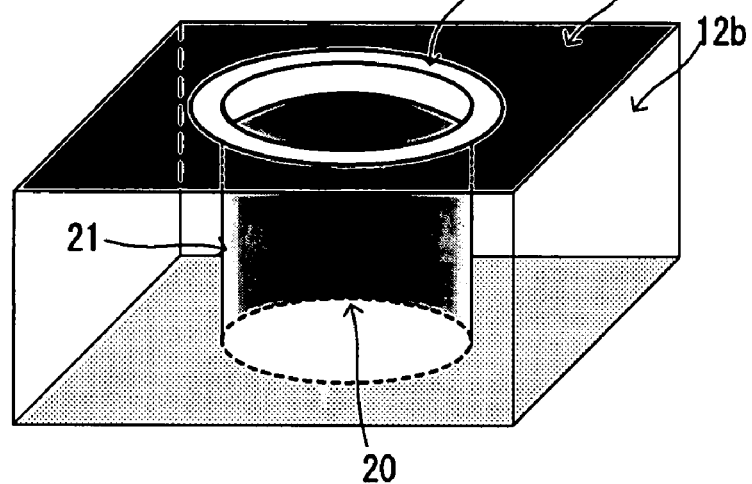

FIG. 8A, FIG. 8B, and FIG. 8C are cross sectional views and a partial perspective view showing the fifth configuration example of the nonmetal part that is provided in the electronic component package according to an aspect of the present invention. FIG. 8A and FIG. 8C illustrate a state before sealed by a sealant, and FIG. 8B illustrates a sealed state by the sealant.

The fifth configuration example is a combination of the circular body 22*c* of the aforementioned third configuration example, and the cylindrical body 22*d* of the fourth configuration example.

Similar to the third and the fourth configuration examples as described above, in the fifth configuration example as shown in FIG. 8A to FIG. 8C, the through-hole 20 is a communication hole that communicates the inside and the outside, on the bottom part 12*b* of the case 12, and a metal coating 21 is provided on the inner surface 20*a* of this hole. In addition, a shielding electrode 15 is provided on the inner surface of the case 12.

Here, similar to the above described third configuration example, the shielding electrode 15 and the metal coating 21 may be continuously formed on the rim of the through-hole 20 inside the case. It is further possible to configure such that the shielding electrode 15 and the metal coating 21 are formed with a space therebetween, and the insulating member of the case 12 is exposed.

The nonmetal part 22 constituting the flow prevention part according to an aspect of the present invention is formed by a circular body 22*e* that is formed by combining the nonmetal circular body 22*c* made of the insulating member and the like mounted on the upper surface of the shielding electrode 15 of the third configuration example, and the cylindrical body 22*d* made of the insulating member that circularly covers at least a part of the inner periphery surface 20*a* of the through-hole 20 in the axial direction. This circular body 22*e* is mounted on the shielding electrode 15 and inner periphery surface 20*a* of the through-hole 20, for example, with an adhesive agent.

In this circular body 22*e*, the length of the part to prevent the inflow of the sealant being melted is equal to a sum of the length in the axial direction of the cylindrical body part provided in the through-hole 20 and the width in the radial direction of the circular body provided on the shielding electrode. The length of each part is determined, considering the length in the axial direction of the through-hole 20 (thickness of the bottom of the case), the length in the axial direction of the metal coating 21 that is necessary for adhesion of the sealant, the length of the insulating part that is necessary for preventing the inflow of the melted sealant, and the like.

The cylindrical body set within the through-hole 20 prevents the sealant 30 melted in the through-hole 20 from moving in the axial direction, and further the circular body provided on the shielding electrode 15 stops the flowing of the sealant into the interior of the case.

Figure 9A:
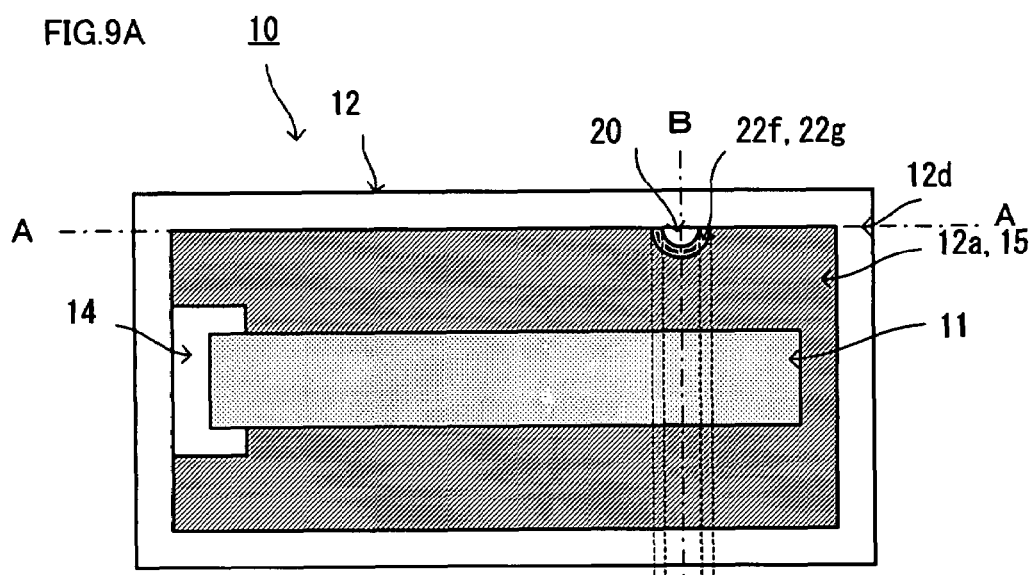
FIG. 9A is a front view and FIG. 9B and FIG. 9C are cross sectional views, each showing a sixth or a seventh configuration example of the nonmetal part that is provided in the electronic component package according to an aspect of the present invention.
Figure 9B:
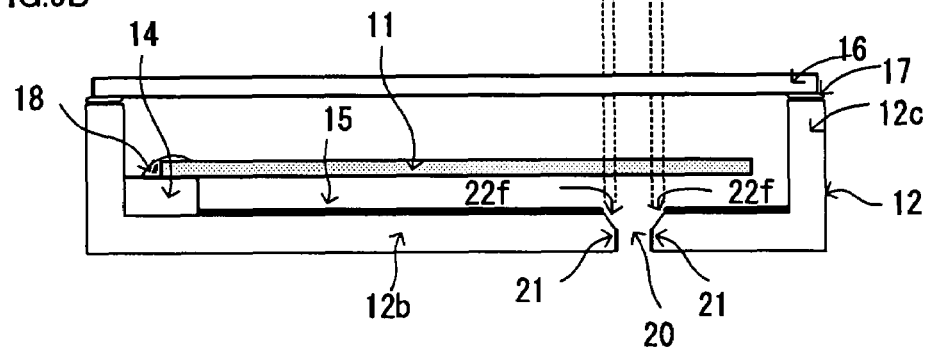
Figure 9C:
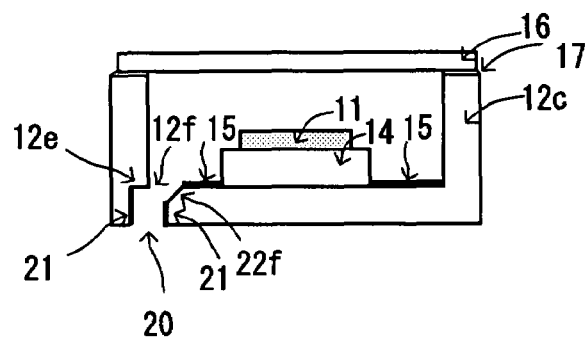

FIG. 9A, FIG. 9B, and FIG. 9C are a front view and cross sectional views each showing the sixth or the seventh configuration example of the nonmetal part provided in the electronic component package according to an aspect of the present invention. It is to be noted that FIG. 9A to FIG. 9C show the sixth configuration example.

In the sixth and seventh configuration examples, the rim of the through-hole 20 inside the case 12 has a conical shape having an inclined cross section. The shielding electrode is formed up to the rim of the inclined plane or in the midway thereof, and an insulating member constituting the case is exposed. Since the other configuration is the same as described with reference to FIG. 2A to FIG. 2C, tedious explanation will not be made.

Figure 10A:
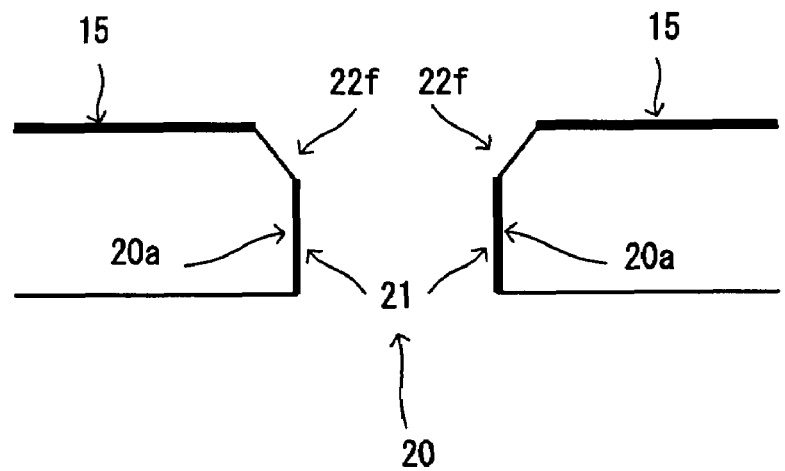
FIG. 10A and FIG. 10B are cross sectional views and FIG. 10C is a partial perspective view each showing the sixth configuration example of the nonmetal part that is provided in the electronic component package according to an aspect of the present invention.
Figure 10B:
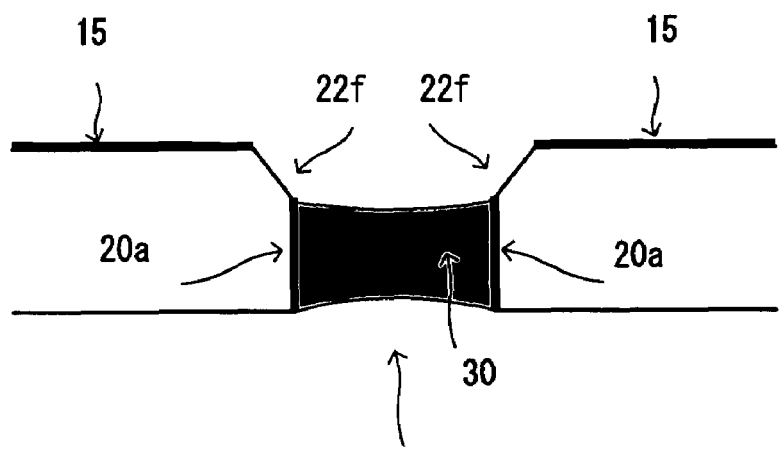
Figure 10C:
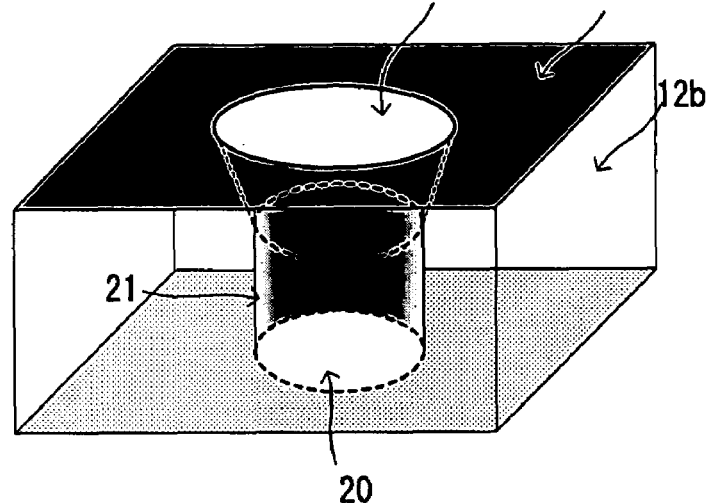

FIG. 10A, FIG. 10B, and FIG. 10C are cross sectional views and a partial perspective view showing the sixth configuration example of the nonmetal part that is provided in the electronic component package according to an aspect of the present invention. FIG. 10A and FIG. 10C illustrate a state before sealed by a sealant, and FIG. 10B illustrates a sealed state by the sealant.

Similar to the first configuration as shown in FIG. 3A to 3C, and the second configuration example as shown in FIG. 5A to 5C, the through-hole 20 is a communication hole that communicates the inside and the outside of the case, on the bottom part 12*b* of the case 12. On the inner periphery surface 20*a* of this hole, there is provided a metal coating 21 made of a metal layer being nickel-based with gold-plated on the surface, which is superior in wettability with a brazing filler of the sealant 30. In addition, a shielding electrode 15 is provided on the inner surface of the case 12. It is possible to provide the shielding electrode 15 by plating, coating or the like.

The nonmetal part 22 constituting the flow prevention part according to an aspect of the present invention has an inclined plane on the inner rim of the through-hole 20 inside the case, and an insulating member constituting the case is exposed as it is, without providing the shielding electrode 15 on this inclined plane.

The part to expose the insulating member of the case 12 is formed as the entire inclined plane or as a part of the inclined plane on the inner periphery surface 20*a* of the through-hole 20. The exposed part of the inclined plane serves as a circular body 22*f* that surrounds a part of the metal coating 21 of the through-hole 20. Therefore, this circular body 22*f* is formed by the insulating member without the metal coating 21 thereon, on the inner periphery surface 20*a* of the through-hole 20. It is to be noted that the length of the inclined part of the inclined plane and the width of the ring of the circular body 22*f* may be arbitrarily determined according to a flowability of the melted sealant 30 or a quantity or the like of the sealant 30, within the width range so that the melted sealant 30 does not go over the ring part of the circular body 22*f*.

Figure 11A:
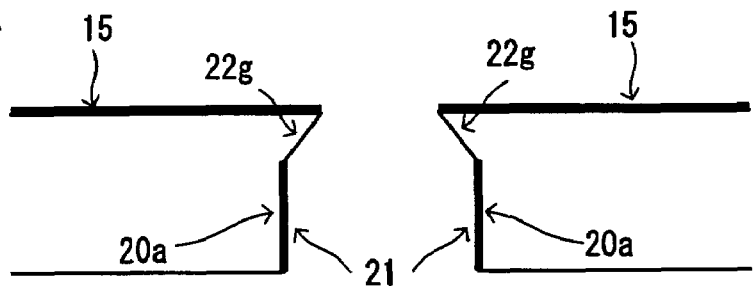
FIG. 11A to FIG. 11D are cross sectional views each showing the seventh configuration example of the nonmetal part that is provided in the electronic component package according to an aspect of the present invention.
Figure 11B:
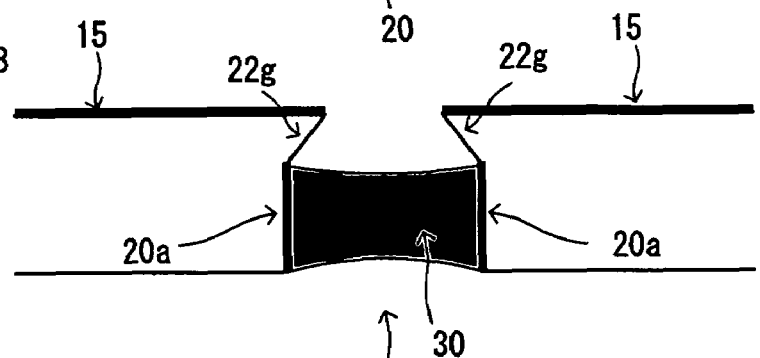
Figure 11C:
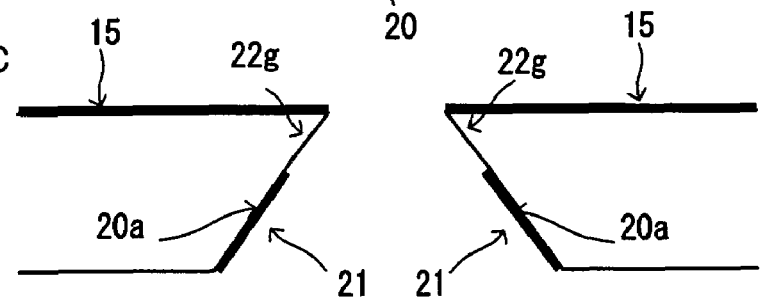
Figure 11D:
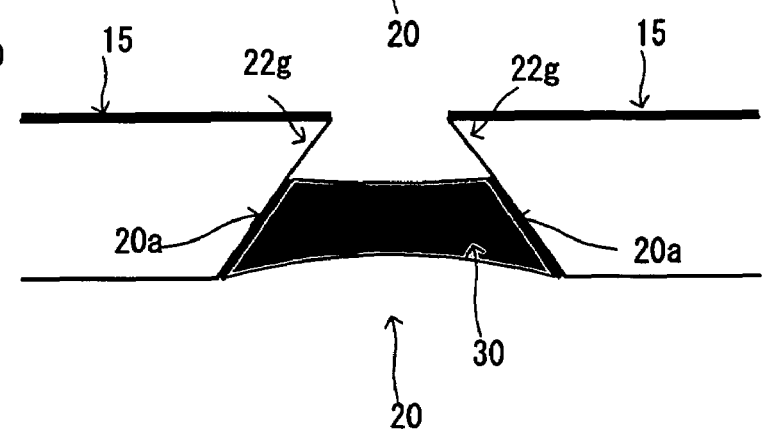

FIG. 11A to FIG. 11D are cross sectional views showing the seventh configuration example of the nonmetal part that is provided in the electronic component package according to an aspect of the present invention. FIG. 11A and FIG. 11C illustrate a state before sealed by a sealant, and FIG. 11B and FIG. 11D illustrate a sealed state by the sealant.

The circular body 22*g* of the configuration examples as shown in FIG. 11A to FIG. 11D have an angle of gradient different from the sixth configuration examples as shown in FIG. 10A to 10C, and the inner diameter inside the case 12 is made smaller. The circular body 22*g* of the examples shown in FIG. 11C and FIG. 11D has a configuration in which the whole length in the axial direction of the through-hole 20 is inclined. The configuration example as shown in FIG. 1A to FIG. 11D also bring about an effect similar to an effect of the sixth configuration example as described above.

Hereinafter, with reference to FIG. 12A to FIG. 23, a method for manufacturing the oscillator package according to an aspect of the present invention and preferable embodiments of the oscillator package that is manufactured by this manufacturing method will be explained in detail. Here, as an example of the oscillator package, a package for a crystal oscillator will be explained, which stores a crystal oscillator within the case and which is airtightly sealed. In particular, an explanation will be made as to an example in which the crystal oscillator is surface-mounted.

Figure 12A:
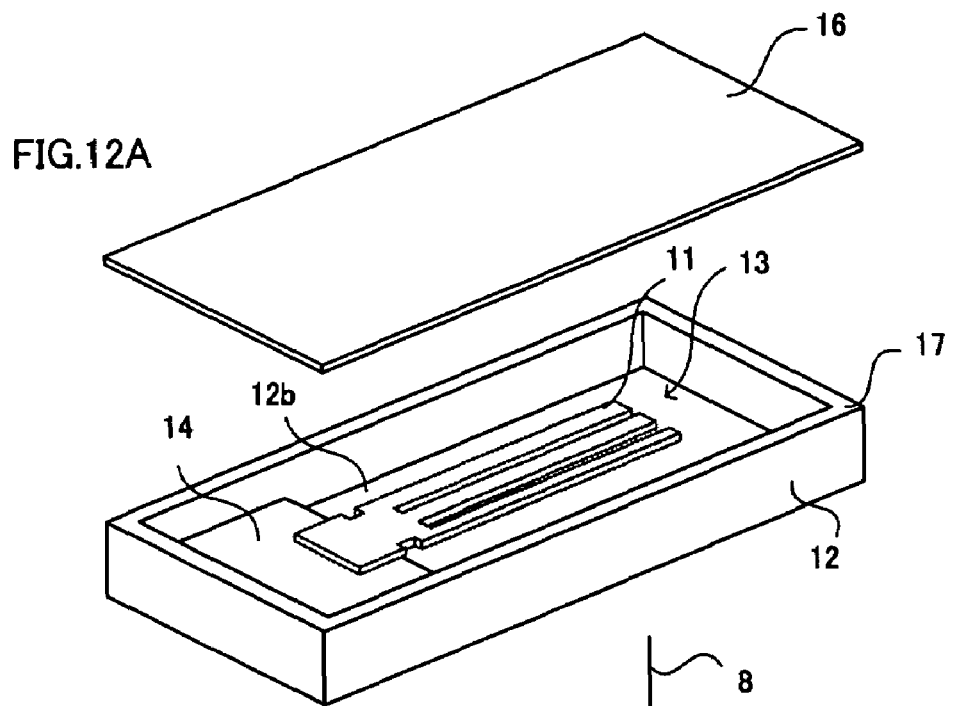
FIG. 12A to FIG. 12C are schematic illustrations to explain a schematic configuration of an oscillation package and a primary welding step according to an aspect of the present invention.
Figure 12B:
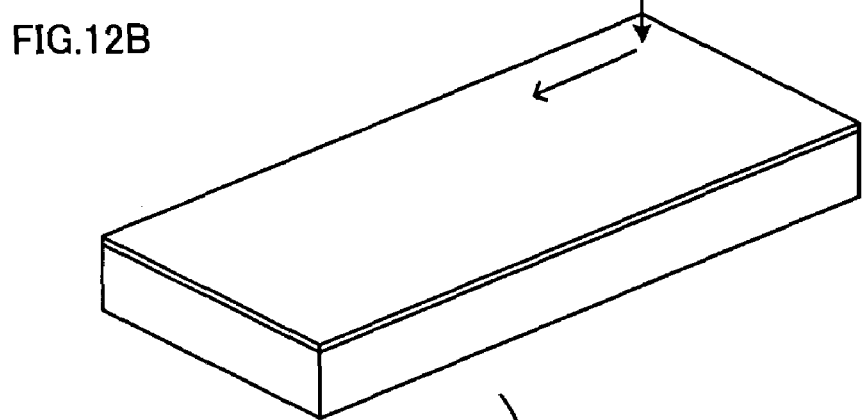
Figure 12C:
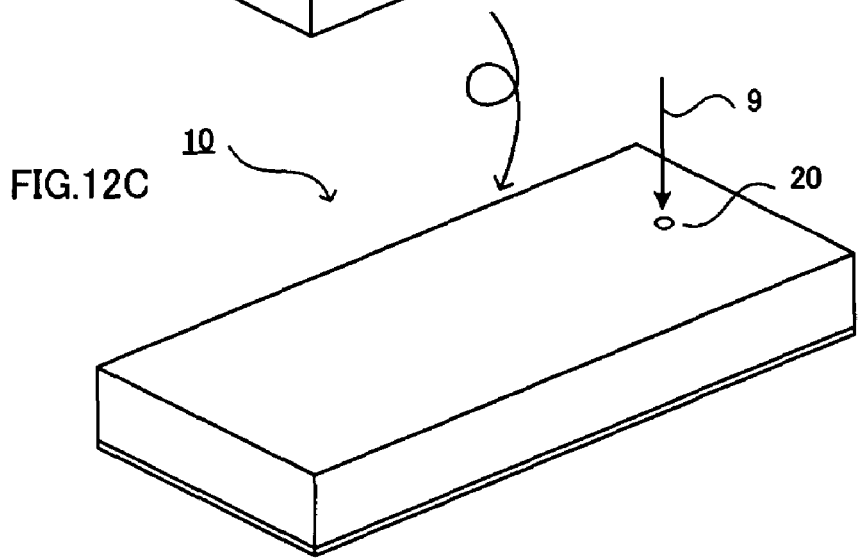
Figure 13:
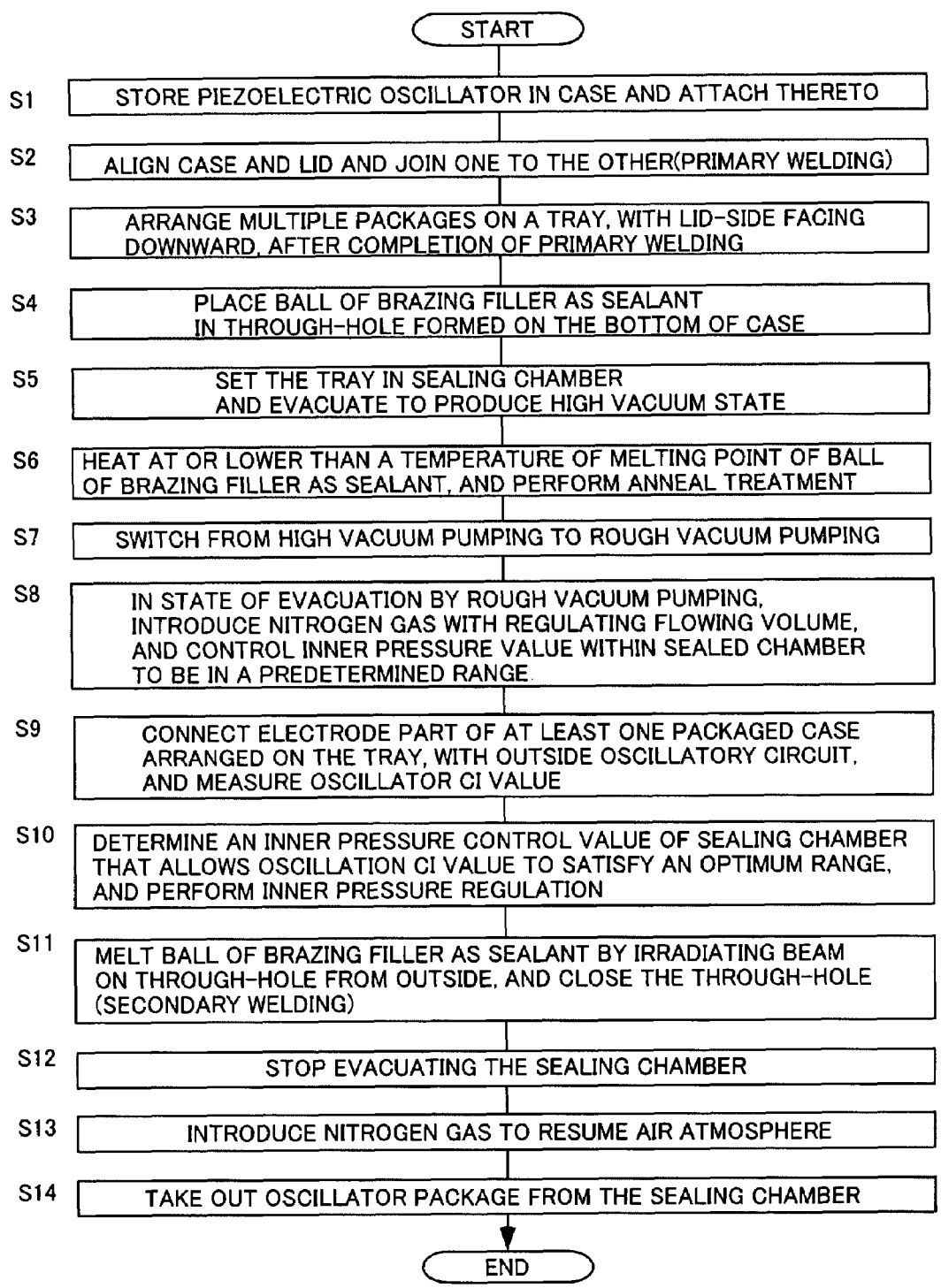
FIG. 13 is a flowchart showing each step of a method for manufacturing the oscillator package according to an embodiment of the present invention.
Figure 14A:
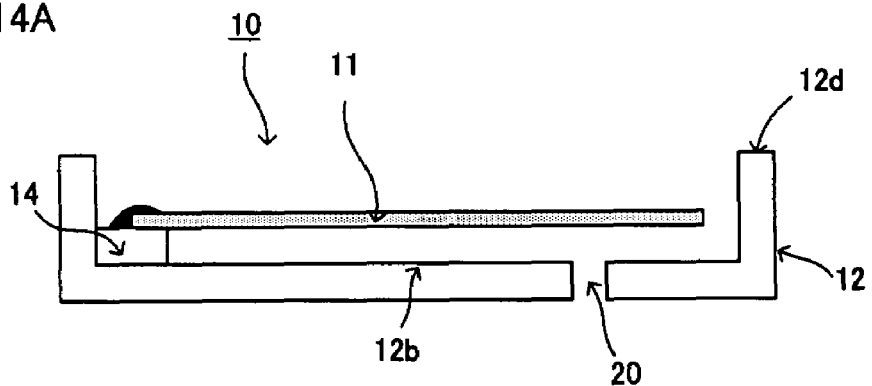
FIG. 14A to FIG. 14C are schematic illustrations to explain the primary welding step.
Figure 14B:
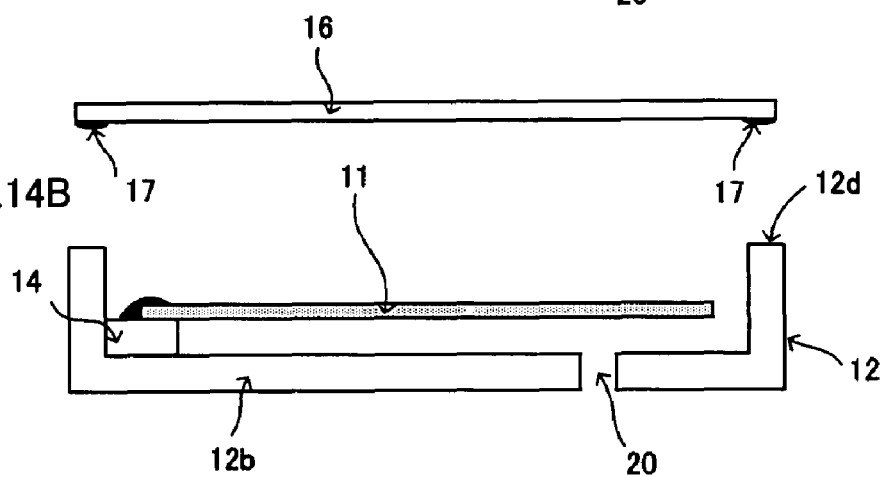
Figure 14C:
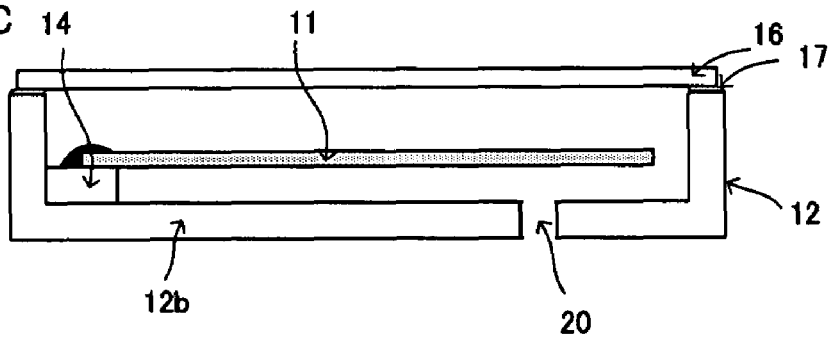
Figure 15:
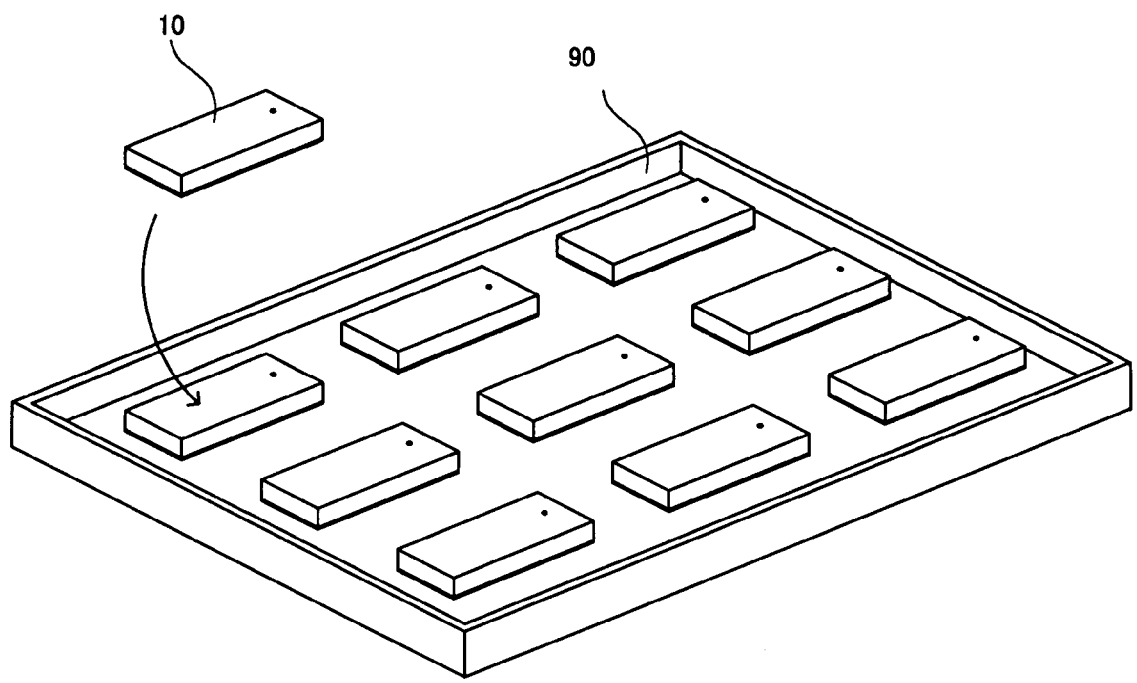
FIG. 15 is a schematic illustration to explain an arrangement of the oscillator packages on the tray prior to be subjected to a secondary welding.
Figure 16:
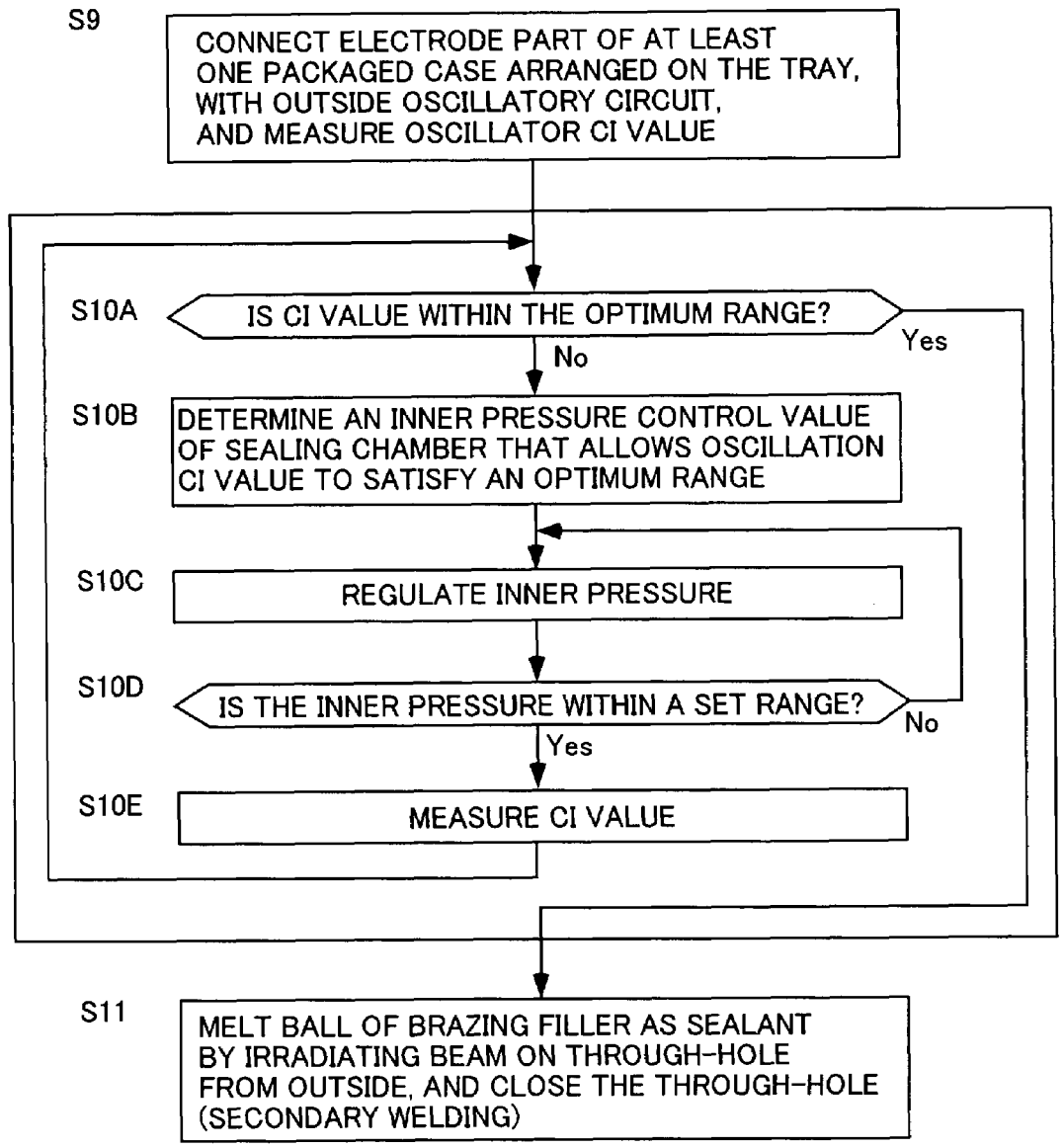
FIG. 16 is a flowchart showing an example of steps of internal pressure control within a sealing chamber.
Figure 17:
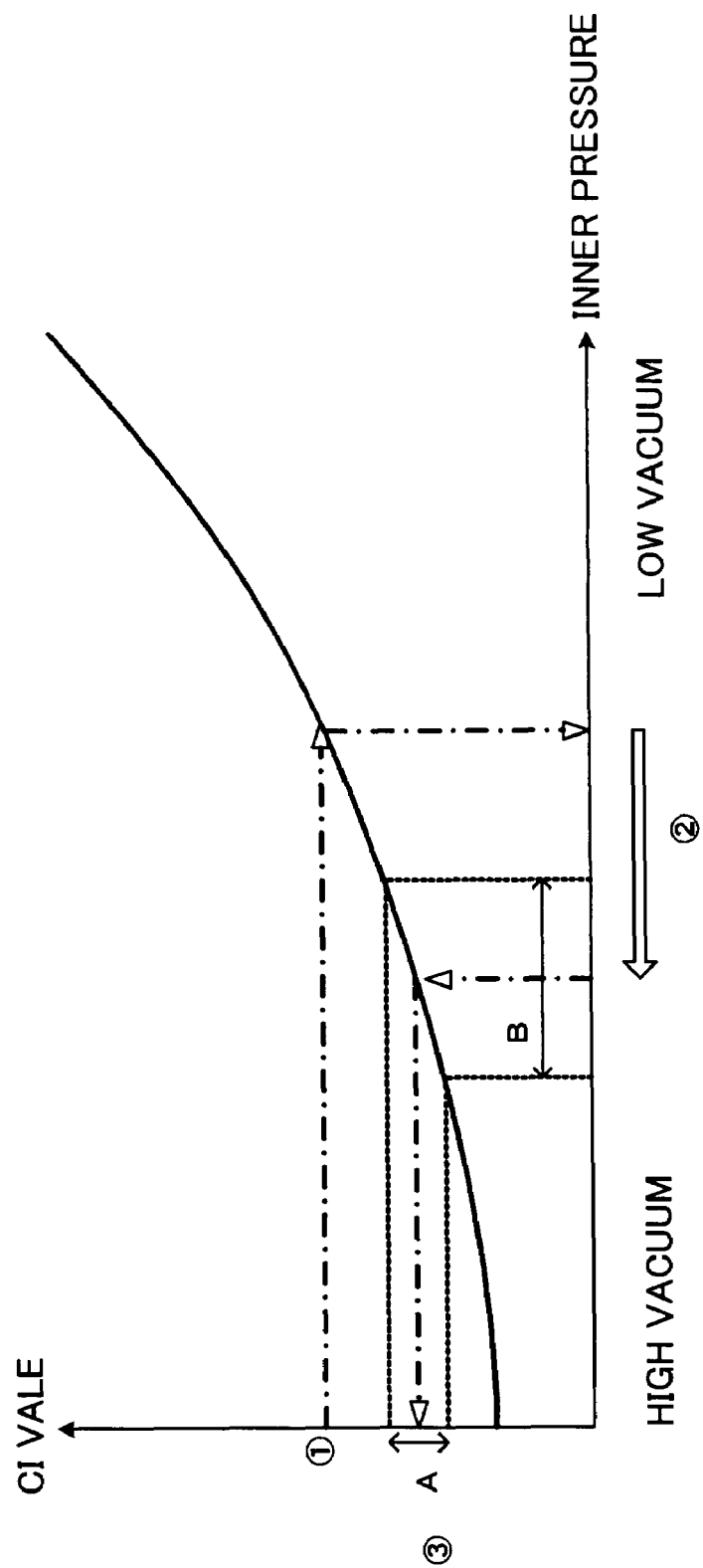
FIG. 17 is a chart showing a relationship between the internal pressure and the crystal impedance value (CI value)
Figure 18:
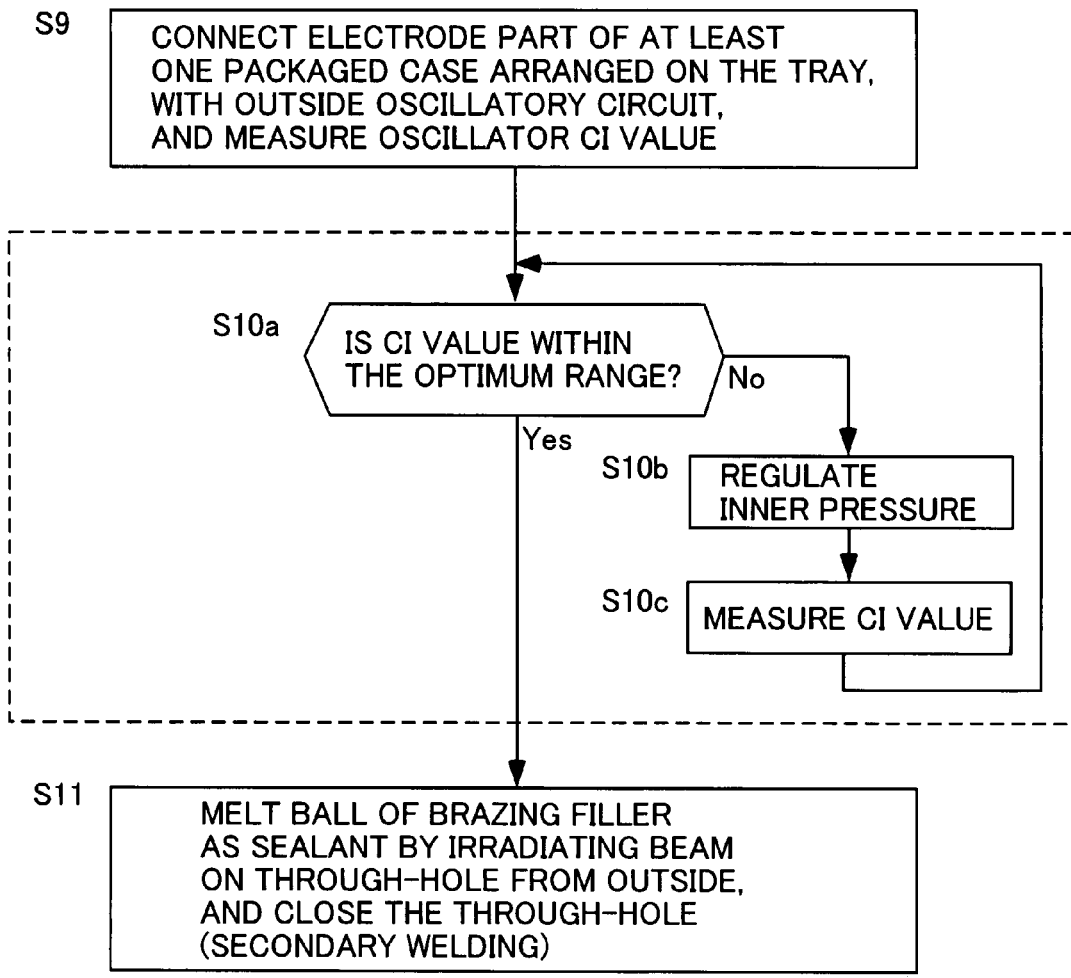
FIG. 18 is a flowchart showing another example of steps of the internal pressure control within the sealing chamber.
Figure 19:
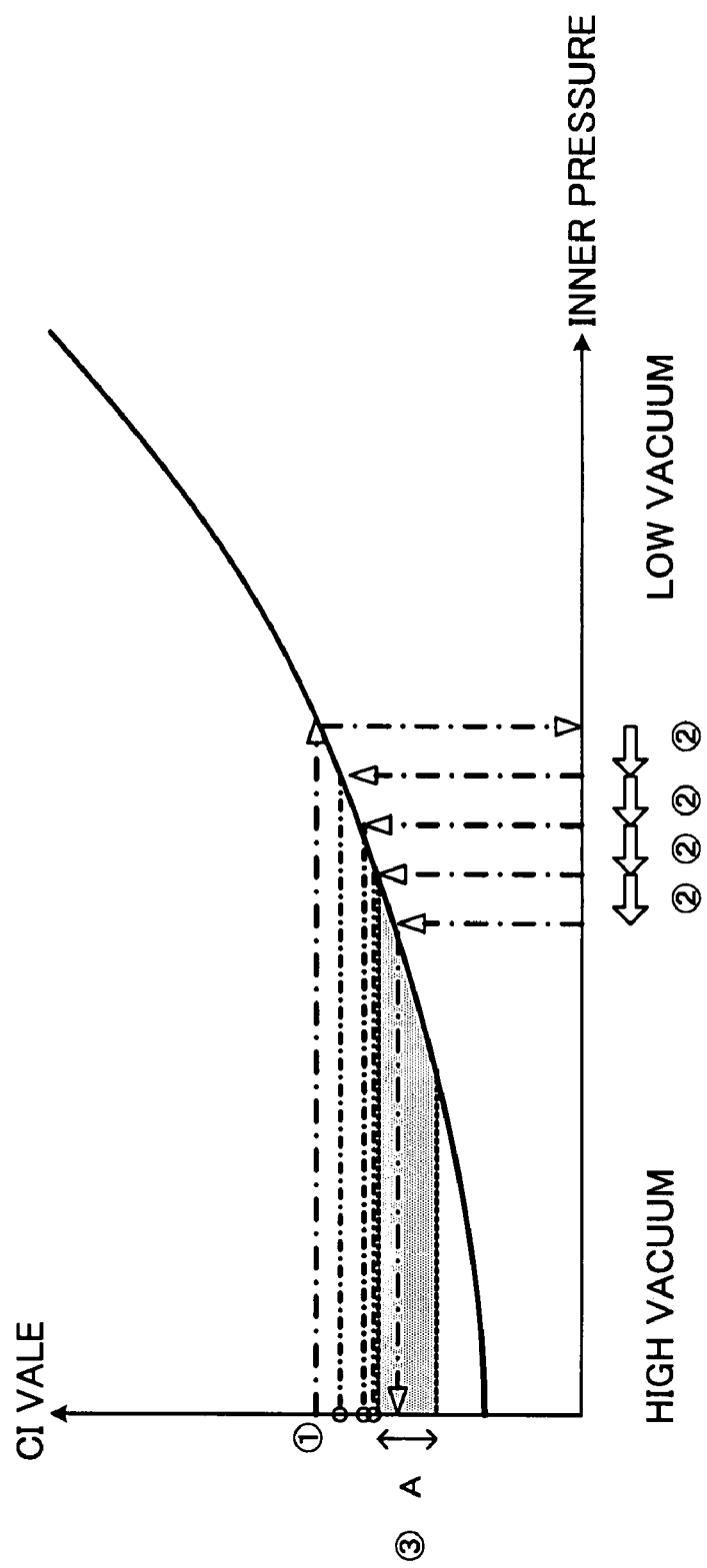
FIG. 19 is a chart showing a relationship between the internal pressure and the crystal impedance value (CI value)

FIGS. 12A, 12B, and 12C are schematic illustrations to explain a configuration of the oscillator package and a primary welding step, according to an aspect of the present invention. FIG. 13 is a flowchart that indicates each step of the method for manufacturing the oscillator package according to an embodiment of the present invention. FIG. 14A to FIG. 14C are schematic illustrations to explain the primary welding step. FIG. 15 is a schematic illustration to explain an arrangement of the oscillator packages prior to performing a secondary welding. FIG. 20A to FIG. 20D are schematic illustrations to explain the secondary welding step. FIG. 16 is a flowchart indicating an example of steps of internal pressure regulation within the sealing chamber. FIG. 17 is a chart that shows a relationship between an internal pressure and a crystal impedance value (CI value) in the above step. FIG. 18 is a flowchart indicating an alternative example of steps of the internal pressure regulation within the sealing chamber. FIG. 19 is a chart that shows a relationship between the internal pressure and the crystal impedance value (CI value) in this alternative example.

Figure 21:
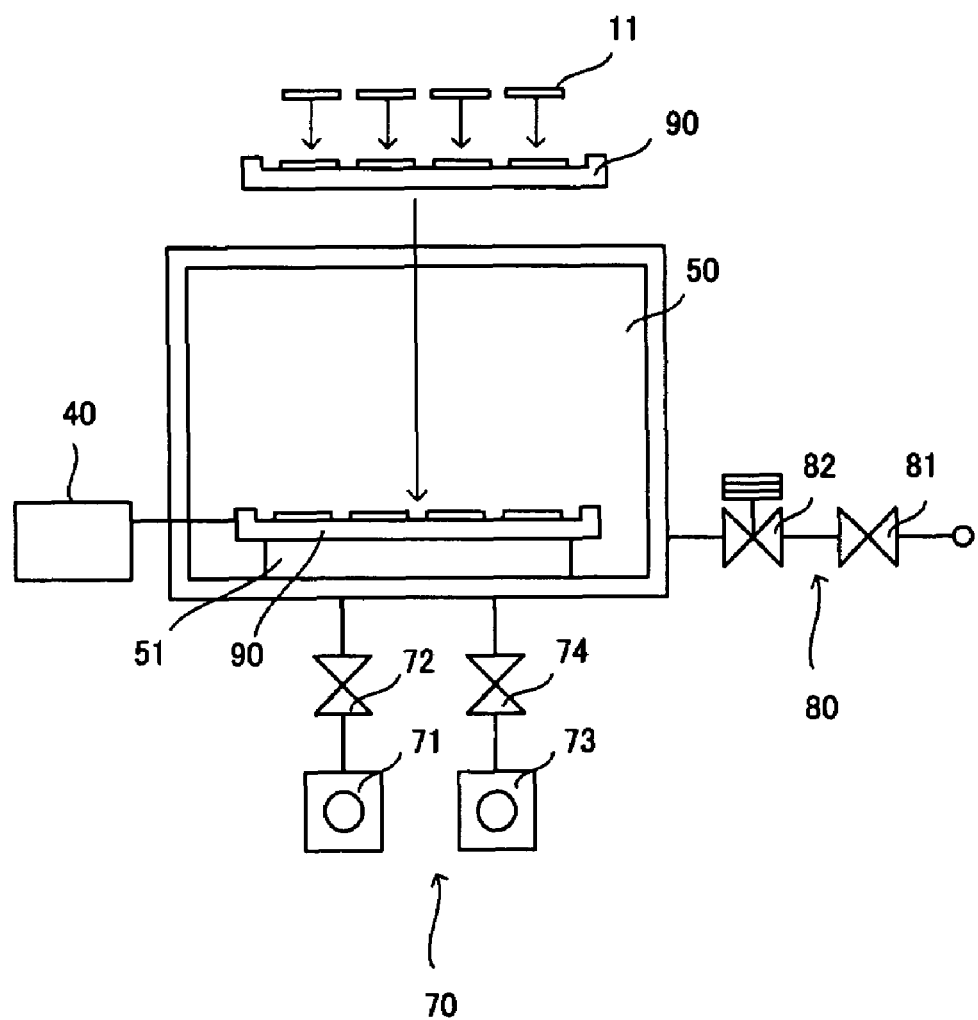
FIG. 21 illustrates a schematic configuration for manufacturing the oscillator package according to an embodiment of the present invention.
Figure 22:
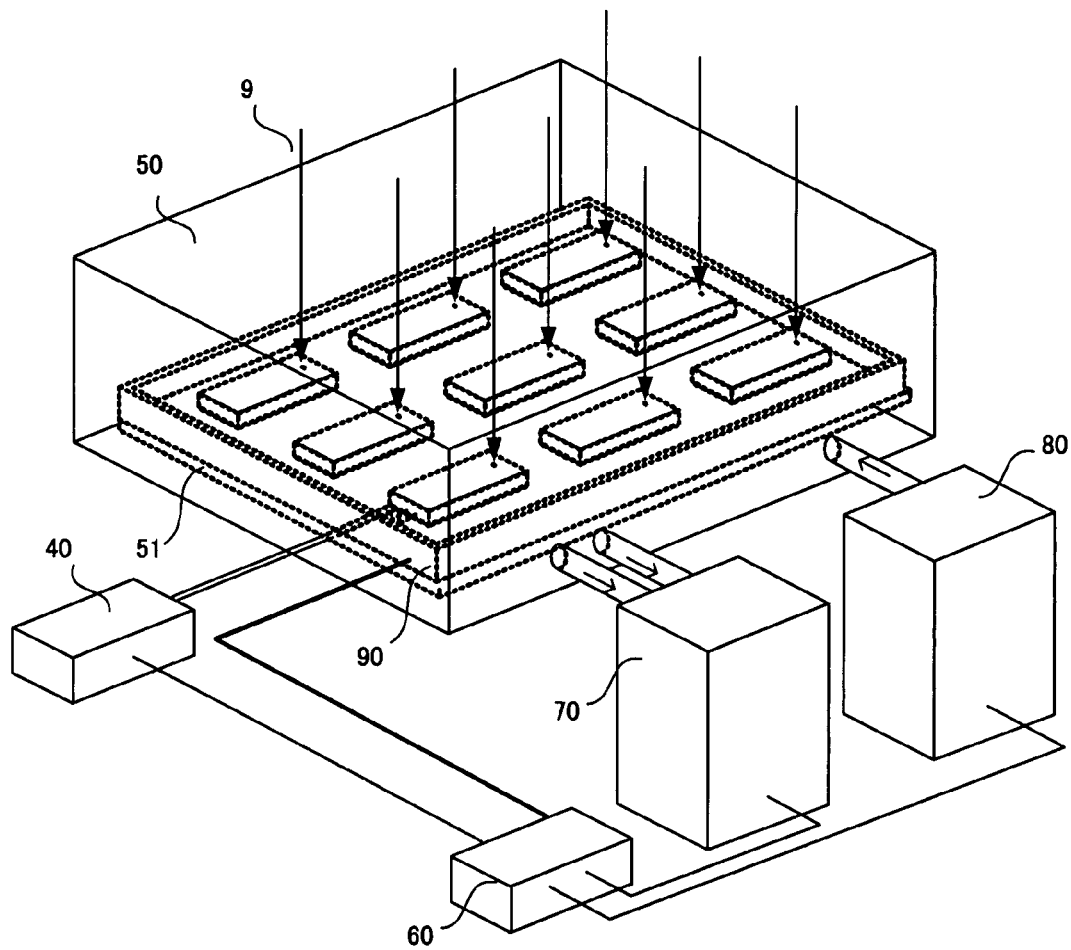
FIG. 22 illustrates a schematic configuration for manufacturing the oscillator package according to an embodiment of the present invention.
Figure 23:
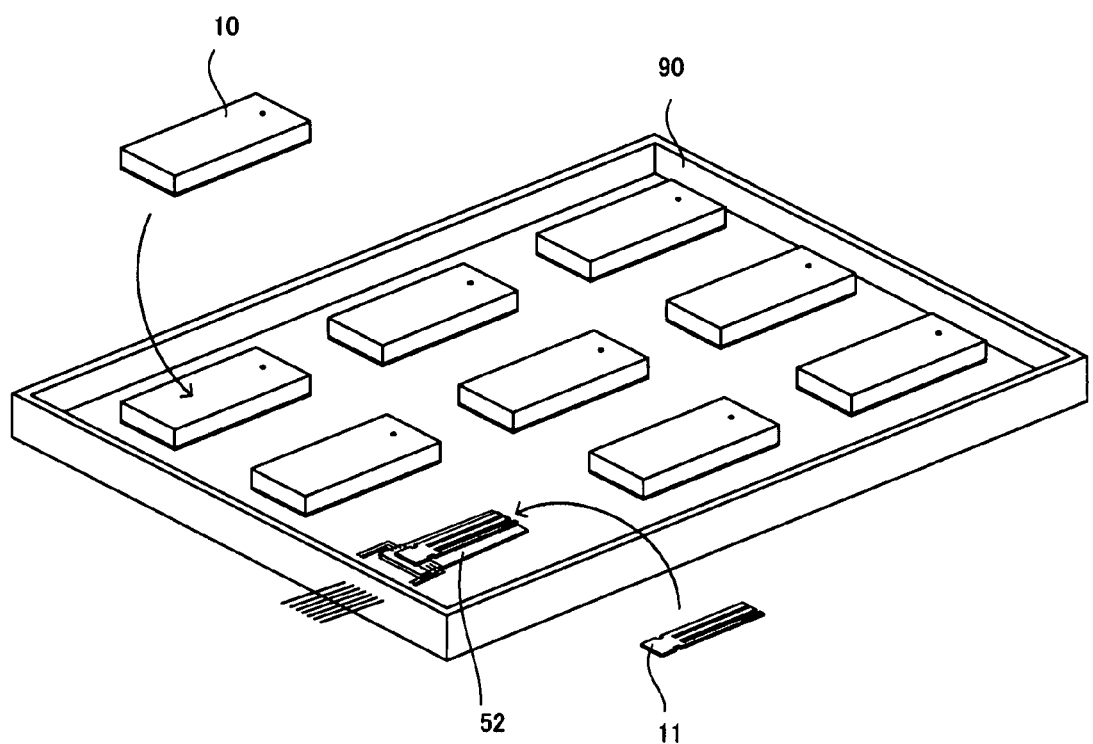
FIG. 23 is a schematic illustration to explain another arrangement of the oscillator packages on the tray, prior to the secondary welding.

FIG. 21 and FIG. 22 are illustrations to explain a schematic configuration to manufacture the oscillator package relating to an embodiment of the present invention. FIG. 23 is a schematic illustration to explain an alternative arrangement on the tray, of the oscillator packages that have not been subjected to the secondary welding.

Firstly, a configuration of the oscillator package as shown in FIG. 12A to FIG. 12C will be explained. The electronic component package 10 is made up of a case 12 (FIG. 12B) that stores an oscillator 11 such as a crystal oscillator in a box type storage having an opening, and a lid 16 to seal the opening of the case 12 via a sealant 17 (FIG. 12A). The case 12 is made up of a bottom wall, and a sidewall provided along the outer periphery of the bottom wall. The case 12 is box type being open-topped, and includes a storage 13 as a storing part to store the oscillator 11 in the upward center of the storage.

Ceramics, a resin, or the like, is taken as an example of constituent material of the case 12. In this example here, the case 12 is made up of ceramics such as aluminum oxide sintered body and aluminum nitride sintered body, for instance. A support 14 is formed on the bottom of the case 12 so as to mount the oscillator 11 thereon, and the oscillator 11 is attached to this support 14 with an adhesive agent, in such a manner as being parallel to the bottom surface of the case. In this way, there is implemented a configuration that stores the oscillator 11 inside the case 12.

After the oscillator 11 is installed within the case 12 as described above, the lid 16 is placed on the sidewall upper face 12a of the case 12 via the sealant 17, thereby sealing the opening of the case 12. The case 12 is aligned and brought into intimate contact with the lid 16, so as to melt the sealant 17 uniformly. It is to be noted that a processing jig is not illustrated here.

FIG. 12B and FIG. 12C illustrate the electronic component package 10 in the state where the lid 16 is attached to the case 12. FIG. 12C illustrates upside-down state of the electronic component package 10 that is shown in FIG. 12B.

In FIG. 12C, on the bottom of the 12b of the case 12, on the opposite side of the lid 16, there is provided a through-hole 20 that communicates the inside of the storage 13 with the outside. This through-hole 20 is sealed according to the secondary welding step that inserts a sealant into the through-hole to fill the through-hole with the sealant, and then melts the sealant.

It is to be noted here that at two central points on the respective narrow sides of the lid 16 are pressed from the lid 16 side, by a roller electrode as a resistance welding machine, whereby the lid 16 may be temporarily attached (temporary welded) to the side wall upper face of the case 12, by the resistance welding on the two points of the respective narrow sides.

As shown in FIG. 12A to FIG. 12C, the lid 16 has a shape with the outer periphery almost corresponding to the outer periphery of the case 12 in plan view, i.e., with a dimension a little smaller than the case 12, if precisely compared. The lid 16 is made of a metal, and in this example here, Fe—Ni—Co alloy, Fe—Ni alloy, or the like, is used for instance.

As the sealant 17 existing between the case 12 and the lid 16, a brazing filler or a solder material made up of eutectic composition, or a low-melting glass is used. Here, the brazing filler and the solder material are distinguished by a melting point. The brazing filler is a material that is melted at 450° C. or higher, and the solder material is a material that is melted at lower than 450° C.

A brazing filler metal is used as the brazing filler, for instance, the brazing filler metal including a silver brazing filler metal made of Ag—Cu alloy, an aluminum brazing filler metal made of Al—Si alloy, a nickel brazing filler metal made of Ni—Cr alloy, a gold brazing filler metal made of Au—Cu alloy or Au—Ni alloy, and a palladium brazing filler metal made of Pd—Ag alloy or Pd—Ni alloy, and the like.

As the solder material, a solder metal is used, for instance, a tin-lead solder made of Sn—Pb alloy, an aluminum solder made of Al—Si alloy, a gold solder made of Au—Si alloy or Au—Sn alloy, and a cadmium solder made of Cd—Zn alloy, and the like.

In addition, the low-melting glass is a glass which is melted and softened between 300° C. and 700° C., specifically, and for example, an inorganic low-melting glass consisting primarily of PbO and $B_2O_3$, a hybrid low-melting glass containing both inorganic and organic substances, or the like, is employed.

In addition, a metalized layer made of tungsten is provided on the sidewall upper end face 12a of the case 12, and nickel plating and gold plating are applied to form layers on the metalized layer (a surface being exposed).

As shown in FIG. 12A to FIG. 12C, the step for sealing the electronic component package 10 includes the primary welding step that welds the lid 16 to the case 12 by irradiating an electron beam 8, and the secondary welding step for irradiating a laser beam 9 into the through-hole 20 provided on the bottom 12b of the case 12 for sealing the case.

In the present embodiment, general electron beam machining equipment may be used for irradiating the electron beam 8, and general semiconductor laser soldering equipment may be used for irradiating the laser beam 9.

In the state where the lid 16 and the case 12 are aligned and firmly attached to each other, the electron beam 8 is scanned and irradiated in a predetermined direction along the rim of the lid 16 from the lid 16 side, so as to melt the sealant 17 at the irradiated part (primary welding step). Thereafter, the electronic component package 10 is sealed by irradiating the laser beam 9 on the sealant placed in the through-hole 20 (secondary welding step).

Next, the sealing process for the electronic component package 10 will be described, with reference to the flowchart as shown in FIG. 13 and the schematic illustrations to explain the first welding as shown in FIG. 14A to FIG. 14C.

Firstly, it is assumed that the case 12 is in the state where the lid 16 is not attached and therefore being opened, and also an electronic component such as a piezoelectric oscillator 11 has not been mounted yet. The through-hole 20 is in a state of opened. In this situation, one end of the oscillator 11 is put on the support 14 provided on the bottom 12a within the case 12, and fixed thereon with an adhesive agent or the like (FIG. 14A) (S1).

Then, the lid 16 is aligned, so as to be arranged and joined to the sidewall upper end face 12a of the case 12, so that the lid seals the opening of the case 12. In this primary welding process, the electron beam 8 is irradiated to the electronic component package 10 from the lid 16 side, within the sealing chamber where a high vacuum condition is held, and sequentially scanned along the overall rim of the lid 16. Accordingly, the sealant 17 is melted on the entire rim of the lid 16, and the lid 16 and case 12 are completely welded. On this occasion, the pressure within the sealing chamber for the primary welding process becomes highly vacuum state (FIG. 14B and FIG. 14C) (S2).

It is to be noted that in the example here, welding is conducted between the lid 16 and case 12 using the electron beam 8. However, a welding method other than the electron beam irradiation may be available. For example, the welding may be conducted by a laser beam irradiation, or by heating the lid 16 and the case 12 using a vacuum heating furnace, a halogen lamp, or the like. Considering a requirement for high-speed working, welding using the electron beam is suitable.

In the primary welding process between the case 12 and the lid 16 as described above, gas or the like may be generated. For instance, the gas may be issued from a volatile component from the sealant 17, a volatile component attached to the electronic component package 10, or the like. This gas is exhausted to the outside (here, within the sealing chamber in the high vacuum state) from the storage 13 of the electronic component package 10 via the through-hole 20 that is disposed at the bottom 12b of the case 12.

Next, multiple electronic component packages 10 as to which the primary welding has been completed are arranged on the tray with the lid 16 side down. FIG. 15 is a schematic illustration to describe how the electronic component packages 10 are arranged on the tray 90. The tray 90 is a support member that transports into the sealing chamber (not illustrated) the multiple electronic component packages 10 being arranged therein. Those multiple electronic component packages 10 are arranged within the sealing chamber so as to be simultaneously subjected to evacuation, and at the same time, nitrogen gas or inactive gas is introduced to set the pressure to a predetermined level. It is to be noted that the number of the electronic component packages 10 arranged on the tray 90 can be determined arbitrarily according to an inner volume of the sealing chamber, exhausting capacity of the evacuation system, and the number of oscillators contained in a common lot (S3).

Figure 20A:
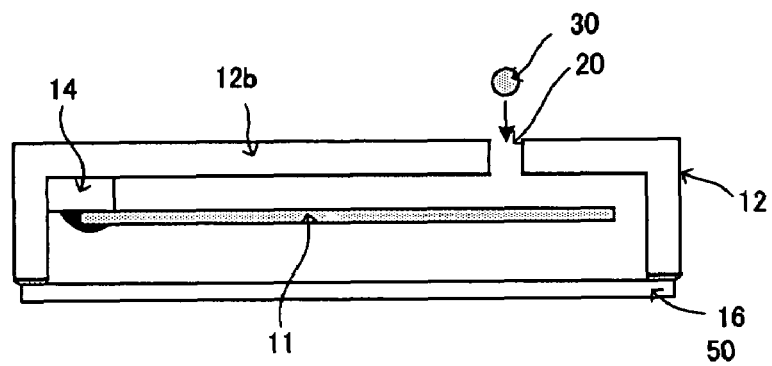
FIG. 20A to FIG. 20D are schematic illustrations to explain the secondary welding step.
Figure 20B:
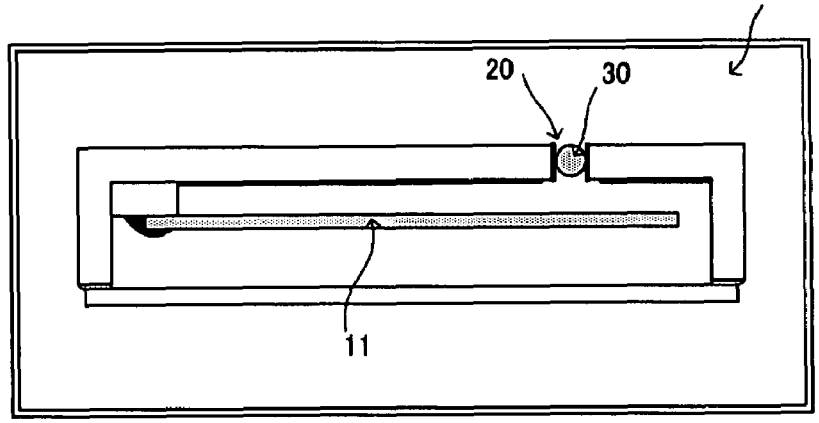
Figure 20C:
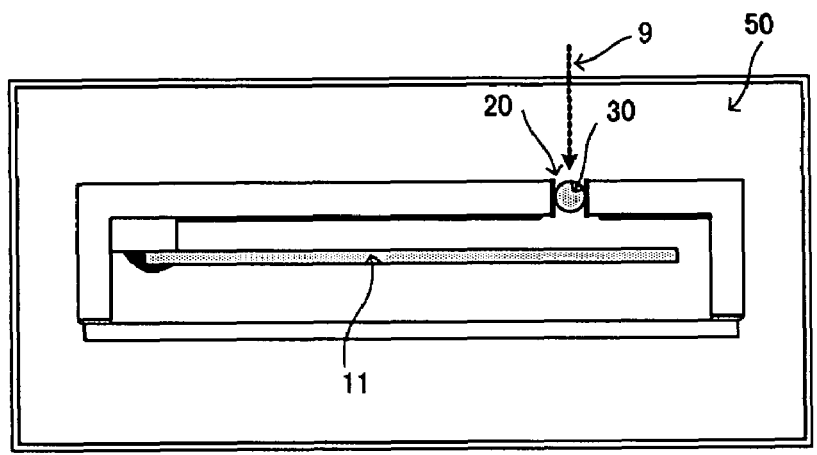
Figure 20D:
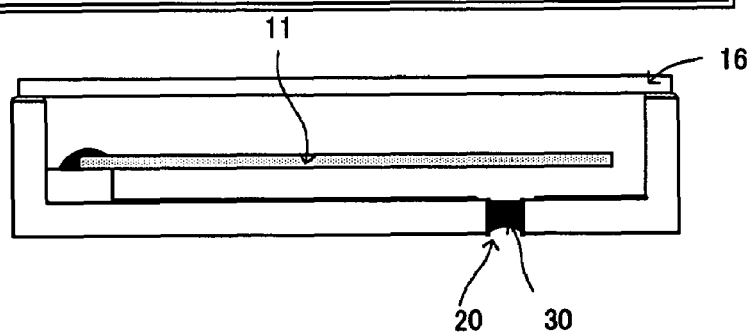

The electronic component packages 10 arranged on the tray 90 in such a manner that they are reversed to make the bottom 12b and the through-hole 90 of each case 12 to face upwardly. Under this condition, the sealant 30 such as a ball of brazing filler metal is inserted into the through-hole 20 (FIG. 20A) (S4), and the electronic component packages 10 are stored into a sealing working chamber 50. This sealing working chamber 50 is a chamber to store inside the electronic component package 10. As shown in FIG. 20B to FIG. 20C, and FIG. 21, the sealing working chamber is provided with an exhaust system 70 to evacuate the chamber, a gas supply mechanism 80 to introduce into the sealing working chamber 50, gas or rare gas such as nitrogen gas, and a heating mechanism to heat the electronic component packages 10 being stored up to a predetermined temperature.

In the state where the electronic component packages 10 are stored in the sealing working chamber, the exhaust system 70 evacuates the sealing working chamber 50. On this occasion, the air within the case 12 of the electronic component package 10 is exhausted through the through-hole 20. The exhaust system 70 includes an exhaust system for main pumping and an exhaust system for rough pumping. In FIG. 21, the exhaust system for rough pumping is provided with a rough-pumping use pump 71 and a rough-pumping use valve 72, and it evacuates the sealing working chamber 50 at a high speed to a low vacuum state, relatively lower than atmosphere pressure. For example, an oil rotary pump or a mechanical dry pump may be used as the rough-pumping use pump 71.

In addition, the exhaust system for main pumping is provided with a main-pumping use pump 73 and a main-pumping use valve 74, and it evacuates the sealing working chamber 50 to a higher vacuum state. A turbo molecular pump or a cryo pump can be used as the main-pumping use pump 73, for instance.

When the sealing working chamber 50 is exhausted from the air atmosphere to a high vacuum state, firstly, the rough-pumping use valve 72 is opened, and then the sealing working chamber 50 is evacuated at high speed by the rough-pumping use pump 71 to produce a vacuum to some extent. Thereafter, the rough-pumping use valve 72 is closed and the main-pumping use valve 74 is opened, thereby evacuating to a higher vacuum state by the main-pumping use pump 73 as substitute for the rough-pumping use pump 71 (S5).

Furthermore, the heating mechanism heats and anneals the electronic component packages 10 up to a temperature equal to or less than a melting point of the sealant 30 such as a ball of brazing filler metal.

After evacuating the sealing working chamber 50 to the high vacuum state, the electronic component packages 10 are subjected to a heating process equal to or more than 200° C. Since the sealing working chamber 50 is held in the high vacuum state, a volatile substance existing within the electronic component packages 10 can be exhausted efficiently.

The heating mechanism includes a method to perform heating on a hot plate using a heater, and a direct lamp irradiation onto the electronic component packages 10 by setting a heating lamp such as a halogen lamp. In addition, if an efficiency to cool the electronic component packages 10 is considered, either one of the case 12 and the lid 16 may be irradiated with a laser beam and the electronic component packages 10 may be individually subjected to the heating process. The heater may be provided within the support 51 that supports the tray 90.

Heating by irradiating a laser beam may be conducted, for example, by irradiating the laser beam more than once intermittently, by lowering an output value of a semiconductor laser. Alternatively, the laser beam may be irradiated to each of multiple areas different in positions, once or more than once intermittently.

Accordingly, gas issued from the volatile substances removed by the anneal treatment can be exhausted via the through-hole 20 of the case 12 to the outside of the electronic component package 10 (i.e., into the sealing working chamber 50).

It is further possible that a laser beam is irradiated onto the bottom wall outer surface of the case 12, to perform anneal treatment. In this case, the laser beam may be spot-irradiated to a predetermined area of the bottom wall outer surface of the case 12. Alternatively, the laser beam may be scanned to perform beam irradiation on the predetermined area of the bottom wall outer surface. This laser beam irradiation may be conducted once or more than once intermittently.

For example, the laser beam may be irradiated more than once intermittently onto the same area on the bottom wall outer surface of the case 12. Alternatively, the laser beam may be irradiated onto each of multiple areas differently positioned, once or more than once intermittently.

It is preferable that the output value of the laser beam is lower than the output of the laser beam in the secondary welding step (S11) that is performed later. It is to be noted that the output value lower than the output of the laser beam in the secondary welding step corresponds to a beam output value at which the sealant 17 is hardly melted.

Furthermore, in the anneal treatment that uses the laser beam, the temperature rises radically at the laser irradiated part and an area in proximity thereto, locally, and afterwards, when the laser beam irradiation is suspended, the temperature at these parts falls down radically.

Accordingly, compared to the case where the anneal treatment is performed by heating the overall crystal oscillator package 10, by using a hot plate or heating lamp, it is possible to heat each of the electronic component packages 10 efficiently up to a high temperature at 200° C. or higher, as well as allowing an efficient cooling. Therefore, it is not necessary to set up a cooling step separately.

With this anneal treatment, a gas substance is discharged from the adhesive agent or the sealant, and the exhaust system 70 exhausts the gas substance from the sealing working chamber 50 to the outside (S6).

By closing the main-pumping-use valve 74 and opening the rough-pumping-use valve 72, the main-pumping-use pump 73 is switched to the rough-pumping-use pump 71 (S7). Then, in the state evacuated by the rough-pumping-use pump 71, inactive gas or rare gas such as nitrogen gas is introduced into the sealing working chamber 50 while regulating a flow volume according to a pressure monitor signal, thereby controlling the internal pressure value in the sealing working chamber 50 to be within a predetermined range. Here, the pressure monitor signal monitors a pressure within the sealing working chamber 50 by using a pressure meter or the like, not illustrated, and it indicates a control signal that is calculated from a pressure value and outputted from the controller 60. As the gas that is introduced into the sealing working chamber 50, rare gas such as helium, neon, and argon may be used other than the nitrogen gas. Since the rare gas is a stable atom that does not have a chemical affinity, it is possible to enhance a long-life nature of the oscillator 11, by airtightly sealing the oscillator 11 within the case 12 in this gaseous atmosphere.

As shown in FIG. 21, introduction of gas is carried out by the gas supply mechanism 80. The gas supply mechanism 80 is provided with a gas source, a switching valve 81, and a flow volume control valve 82, and by controlling the flow volume control valve 82 according to the pressure monitor signal, thereby controlling the gas volume to be introduced into the sealing working chamber 50. As shown in FIG. 22, the controller 60 is able to perform switching control and flow volume control of the exhaust system 70 and the gas supply mechanism 80. The controller 60 operates the controls based on a detection output from the detection part 40, thereby controlling the pressure within the sealing working chamber 50. It is to be noted that in controlling the pressure by the controller 60, the pressure within the sealing working chamber 50 is monitored by the pressure meter or the like (not illustrated), and the control can be executed by using a pressure value obtained from this meter.

Since the through-hole 20 is open at this stage, the internal pressure of the case 12 is at the same level as the pressure that is regulated in the sealing working chamber 50 (FIG. 20B) (S8).

An oscillating circuit is connected from the outside with an electrode part of the case 12 of at least one of the electronic component packages 10 that are arranged on the tray, and a crystal impedance value of the oscillator is measured (S9).

In FIG. 21 and FIG. 22, the detection part 40 is provided with an oscillating circuit for a vibratory driving the oscillator 11 of the electronic component package 10, and a measuring circuit that measures a crystal impedance value of the oscillator 11. The controller 60 inputs the crystal impedance value measured by the measuring circuit of the detection part 40, and controls a gas introducing volume by the gas supply mechanism 80, so that the pressure within the sealing working chamber 50 becomes a predetermined level, on the basis of this crystal impedance value and the pressure within the sealing working chamber 50.

In this pressure regulating step, the crystal impedance value (CI value) of the oscillator is measured, and the pressure within the case of the oscillator package is controlled to be a predetermined level, on the basis of the measured crystal impedance value (CI value). The crystal impedance value (CI value) is one of the evaluated values to evaluate a vibration characteristic of the oscillator.

This crystal impedance value (CI value) is an evaluated value relating to a sensitivity of the oscillator, and it has been required conventionally that this crystal impedance value (CI value) is lowered so as to obtain a high sensitivity. Therefore, an effort has been made to reduce the pressure within the case that stores the oscillator. However, if this crystal impedance value (CI value) is too low, there is a problem that it takes time until the drive of the oscillator becomes stable. For the use as an oscillator, it is necessary to set the crystal impedance value (CI value) to a predetermined value that satisfies both a desired detection sensitivity behavior and a starting characteristic that represents a time length required for stability.

When a physical sensor is configured, such as an oscillatory type gyro sensor or an oscillatory type acceleration sensor, in which the oscillator detects a physical quantity applied from the outside, this sensor becomes highly sensitive when the crystal impedance value (CI value) is low, and it is able to detect even a minor change in vibration, but it takes long time until the detected output becomes stable. If the crystal impedance value (CI value) is high, the detection output becomes stable within a short period of time, but it is not able to perform detection following a minor change in vibration.

According to the present invention, in order to set this crystal impedance value (CI value) to a predetermined value, the crystal impedance value is actually measured, and the pressure within the sealing chamber is controlled based on the actually measured value. Furthermore, the pressure within the case of the oscillator package that communicates via the through-hole is regulated, thereby setting the predetermined CI value. Pressure regulation by this controller 60 will be described later (S10).

After the internal pressure within the sealing working chamber 50 is controlled based on the crystal impedance value, the laser beam 9 is irradiated from the outside on the sealant 30 that is inserted into the through-hole 20, thereby heating the sealant 30. Accordingly, the interior of the through-hole 20 is filled with the melted sealant, thereby closing the through-hole 20. This step is referred to as a secondary welding step. Consequently, the case of the electronic component package is airtightly sealed.

A volume of gas generated by melting the sealant 30 in welding (i.e., gas volume sealed inside the electronic component package 10) is extremely small. Therefore, the electronic component package 10 can be airtightly sealed in the atmosphere of a pressure range (for example, 16 Pa to 266 Pa) that is the same as the pressure within the sealing working chamber 50.

By manufacturing the electronic component package 10 under the pressure, for example 16 Pa to 266 Pa, within the sealing working chamber 50, there is an effect that a preferable balance can be obtained between the drive performance and the starting characteristic of the oscillator 11 (FIG. 20C) (S11).

By stopping the exhaust system 70 to stop evacuating the sealing working chamber 50 (S12) and introducing gas from the gas supply mechanism 80 to resume the inside of the sealing working chamber 50 to be the atmospheric pressure level (S13), the electronic component package 10 is taken out from the sealing working chamber 50 (FIG. 20D) (S14).

Hereinafter, with reference to FIG. 16 to FIG. 19, an example to regulate the internal pressure according to the crystal impedance value (CI value) in S10 will be explained.

It is to be noted that there are characteristics as shown FIG. 17 and FIG. 19 between the crystal impedance value (CI value) and the internal pressure (vacuum degree) in the case. If the vacuum becomes higher (left part of the figure), the crystal impedance value (CI value) becomes lower. The degree of vacuum in the figure is expressed by logarithmic scale, though it is not illustrated.

With reference to FIG. 16 and FIG. 17, a first example of the internal pressure regulation will be explained. It is determined whether or not the crystal impedance value of the oscillator (CI value), which is obtained in the step S9, is within the optimum range. FIG. 17 shows a relationship between the internal pressure and the crystal impedance value (CI value). Here, the optimum range of the crystal impedance value (CI value) is indicated by "A", and the internal pressure range corresponding to this optimum range "A" is indicated by "B". If the crystal impedance value of the oscillator (CI value) is within the optimum range, the next step is the secondary welding step in S11 (S10A). On the other hand, if the crystal impedance value of the oscillator (CI value) is not within the optimum range (circled number 1 in FIG. 17), the internal pressure is determined so that the crystal impedance value is brought into the optimum range (circled number 2 in FIG. 17), and this internal pressure is determined as an internal pressure control value of the sealing chamber (S10B). With an aim to achieve the internal pressure control value being determined, the gas supply mechanism 80 is regulated to control the internal pressure (S10C and S10D).

After the internal pressure is rendered within the set range (S10D), the crystal impedance value (CI value) is measured as appropriate (S10E), and it is checked whether or not the crystal impedance value (CI value) is within the optimum range (circled number 3 in FIG. 17) (S10A).

In the regulation example as described above, an internal pressure control value corresponding to the optimum crystal impedance value is set, and the internal pressure is regulated by monitoring the internal pressure with an aim to achieve this internal pressure control value. On the other hand, the internal pressure may be regulated with an aim to obtain an optimum crystal impedance value by monitoring the crystal impedance value. A second example of the internal pressure regulation is to monitor this crystal impedance value.

Hereinafter, with reference to FIG. 18 and FIG. 19, the second example of the internal pressure regulation will be explained. It is determined whether or not the crystal impedance value of the oscillator (CI value), which is obtained in step S9, is within the optimum range. FIG. 19 shows a relationship between the internal pressure and the crystal impedance value (CI value). Here, the optimum range of the crystal impedance value (CI value) is indicated by "A". If the crystal impedance value of oscillator (CI value) is within the optimum range, the next step is the secondary welding step in S11 (S10a). On the other hand, if the crystal impedance value of oscillator (CI value) is not within the optimum range (circled number 1 in FIG. 19), the gas flow volume is regulated by the gas supply mechanism to control the internal pressure (circled number 2 in FIG. 19) (S10b), and then the crystal impedance value (CI value) is measured (circled number 3 in FIG. 19) (S10c). The steps S10b and S10c are repeated until the crystal impedance value (CI value) being measured falls in the optimum range, thereby controlling the internal pressure.

In the second regulation as described above, the internal pressure can be controlled by monitoring the crystal impedance value (CI value). Therefore, it is easy to set a predetermined crystal impedance value (CI value). In this case, it is necessary to consider an influence of vibration that may occur at the time of internal pressure regulation, upon the measurement of the crystal impedance value (CI value). If there is an influence, the crystal impedance value (CI value) should be measured in the state where the vibration is stopped when the internal pressure is regulated.

In addition, in the first regulation as described above, since the internal pressure regulation is carried out by monitoring the internal pressure, the regulation can be executed without considering an influence of the pump vibration when the inner pressure is regulated, upon measuring the crystal impedance value (CI value).

In the method for manufacturing the oscillator package according to the present invention, more than one piezoelectric oscillators 11 are arranged on the tray, and in this state, processes such as the anneal treatment, measurement of the crystal impedance value, regulation of the internal pressure, and a secondary welding are carried out. In the processes above, measuring of the crystal impedance value and outputting of a detection signal from the oscillator are performed via a terminal provided on the oscillator package. Another configuration is possible to measure the crystal impedance value of the oscillator by using the oscillators only, other than using the oscillator package as described above. FIG. 23 shows one example of the above configuration.

In FIG. 23, on the tray 90, only the piezoelectric oscillator 11 is arranged without being stored in a case, in addition to the multiple electronic component packages 10 that are arranged in the same manner as the example shown in FIG. 15. This piezoelectric oscillator 11 is manufactured in the same lot as the oscillators stored in the electronic component packages 10, and provided with a similar crystal impedance value, and this piezoelectric oscillator 11 is used to measure the crystal impedance value. There is provided on the tray 90 a support part 21 to install the piezoelectric oscillator 11, and this support part 21 is provided with a terminal to apply a drive signal to the piezoelectric oscillator 11. By the use of this terminal, the CI value is measured. When installed on the support part 21, the piezoelectric oscillator 11 receives a drive signal from the outside to be driven, and is enabled to measure a CI value as a vibration characteristic. The drive signal is a signal such as a current and electric power to oscillate the oscillator.

With the configuration above, it is possible to measure the crystal impedance value of the oscillator prior to being sealed in the case.

Figure 24:
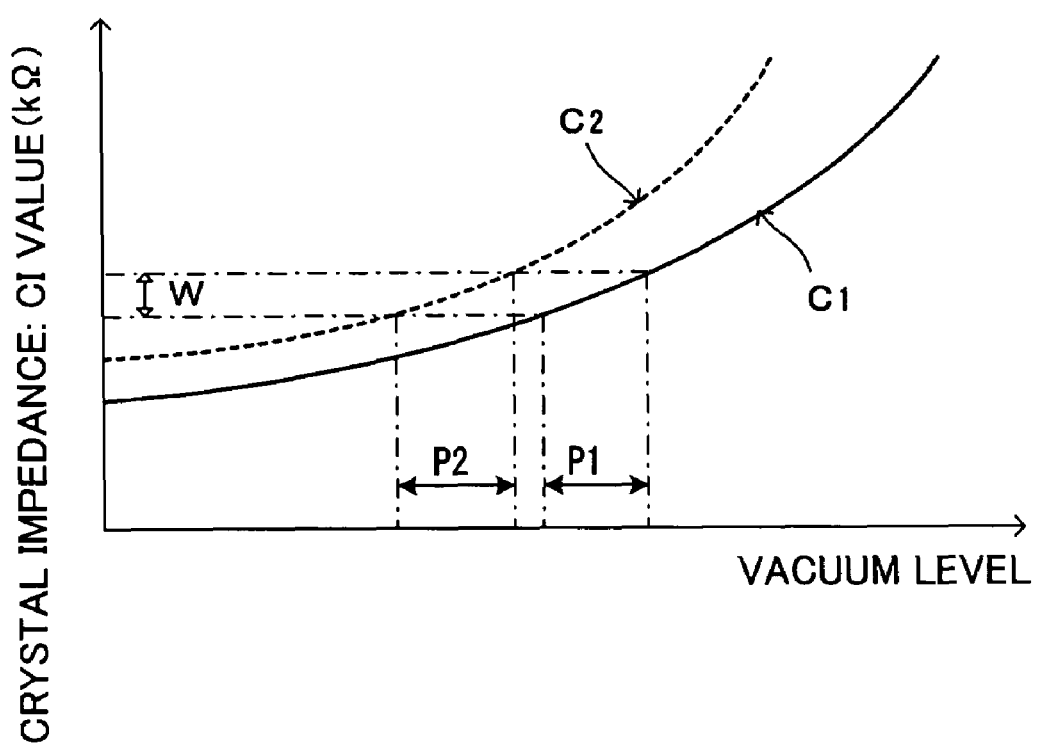
FIG. 24 is a chart schematically showing the CI value with respect to the vacuum level.
Figure 25A:
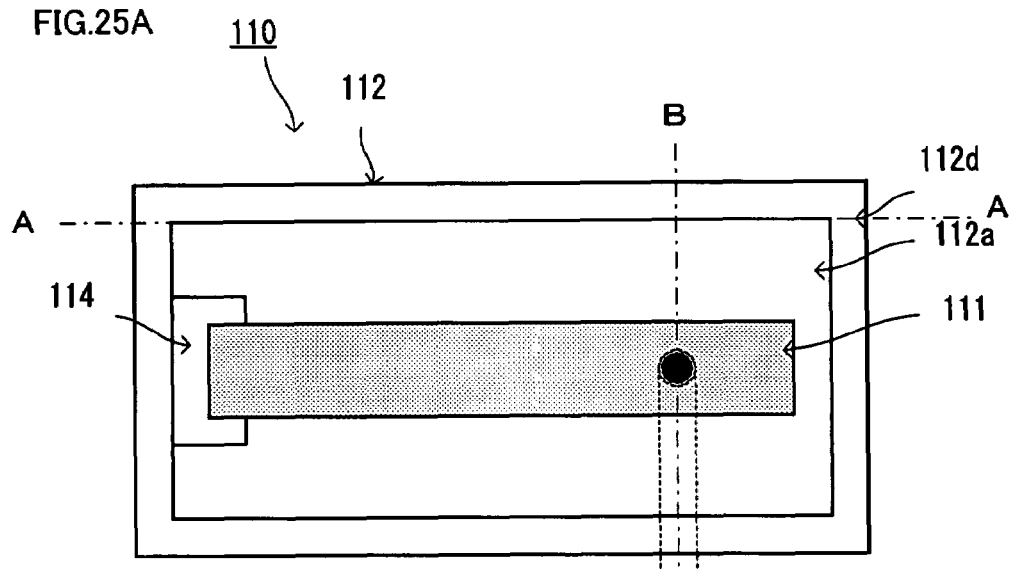
FIG. 25A to FIG. 25C are illustrations to explain a conventional configuration example of the electronic component package that is configured to store an electronic component such as a piezoelectric oscillation device.
Figure 25B:
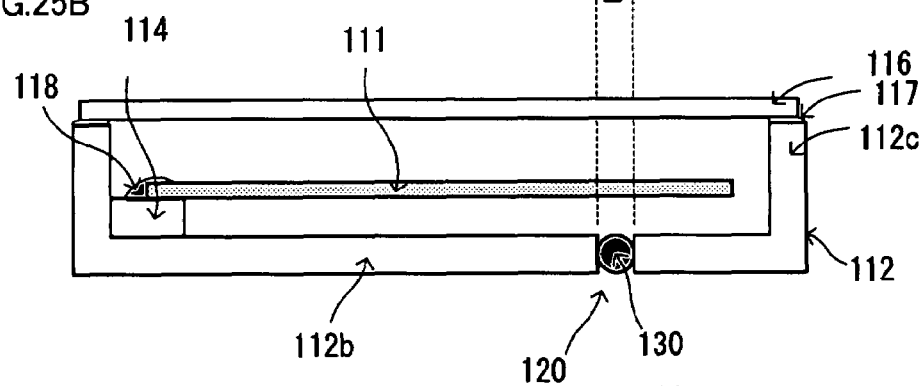
Figure 25C:
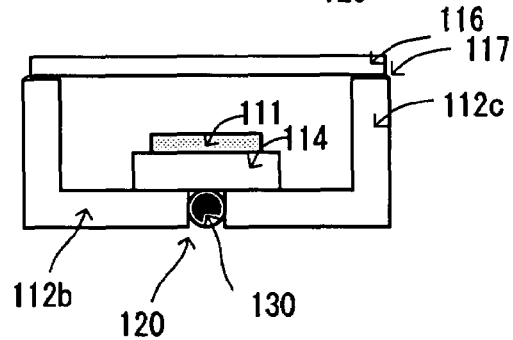
Figure 27A:
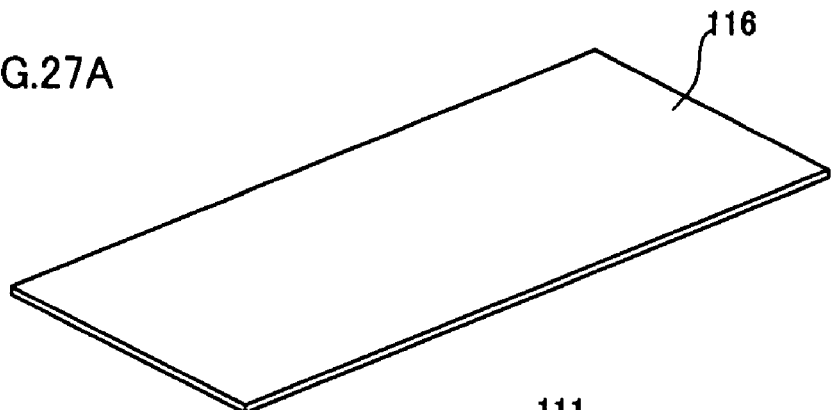
FIG. 27A to FIG. 27C are illustrations to explain a method for manufacturing an oscillator device according to a conventional art.
Figure 27B:
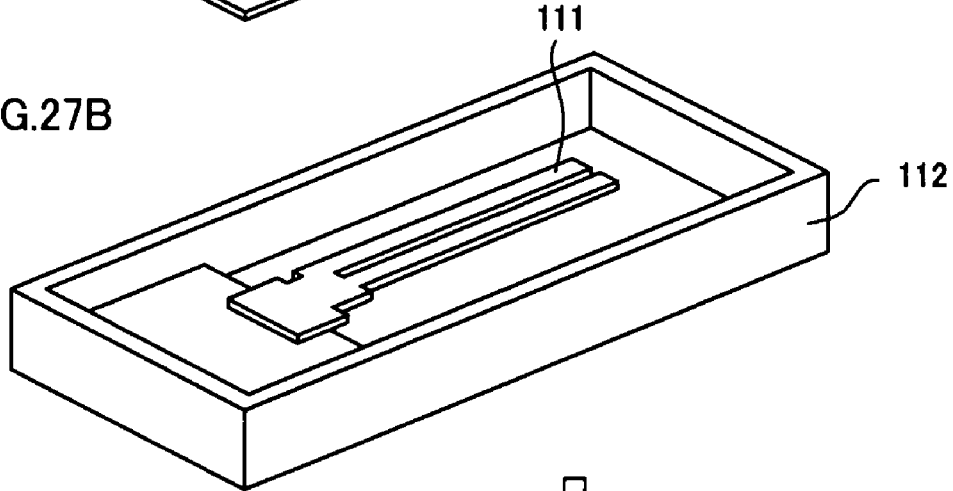
Figure 27C:
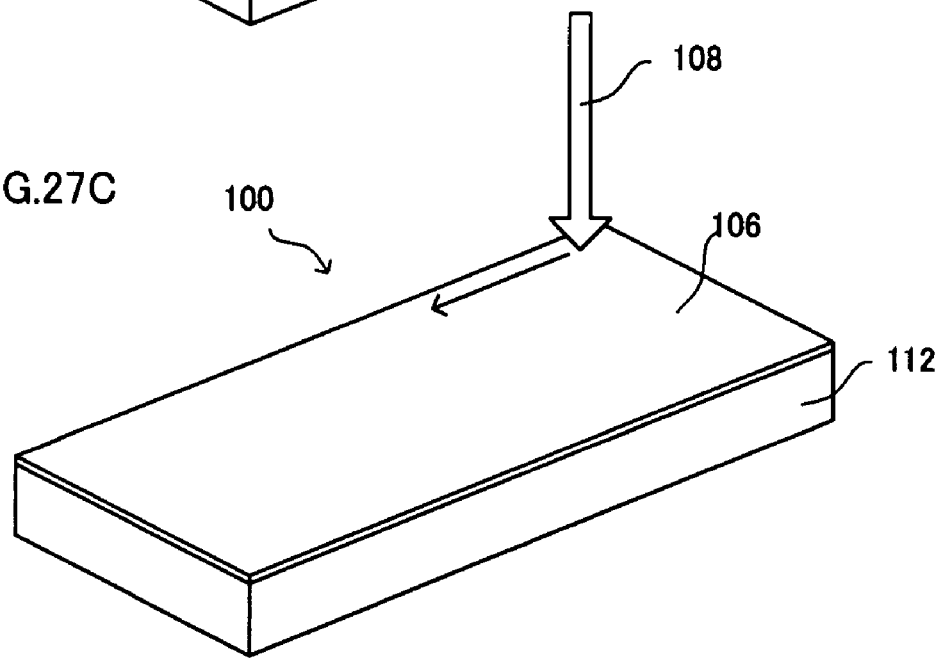
Figure 28:
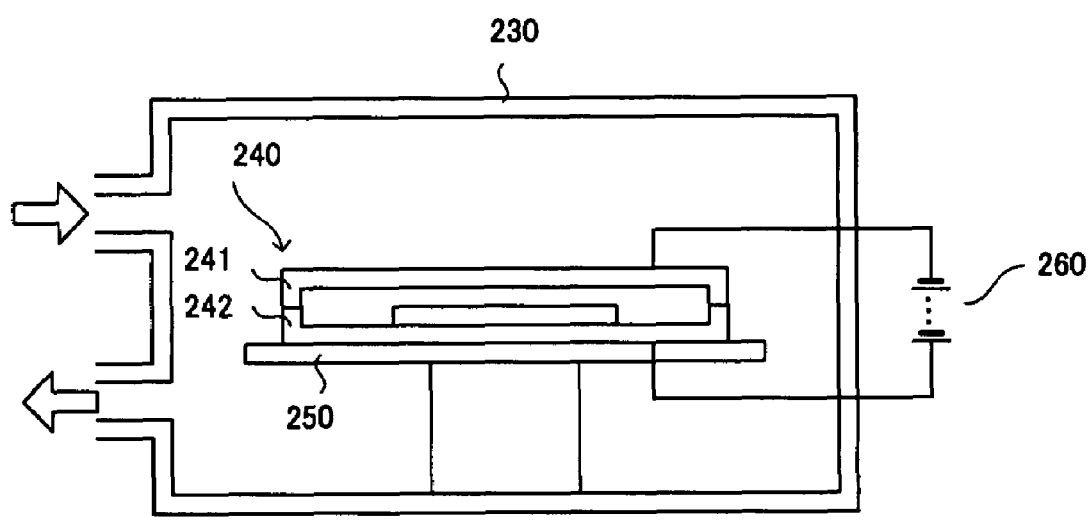
FIG. 28 is an illustration to explain a method for manufacturing an oscillator device according to a conventional art.
Figure 29A:
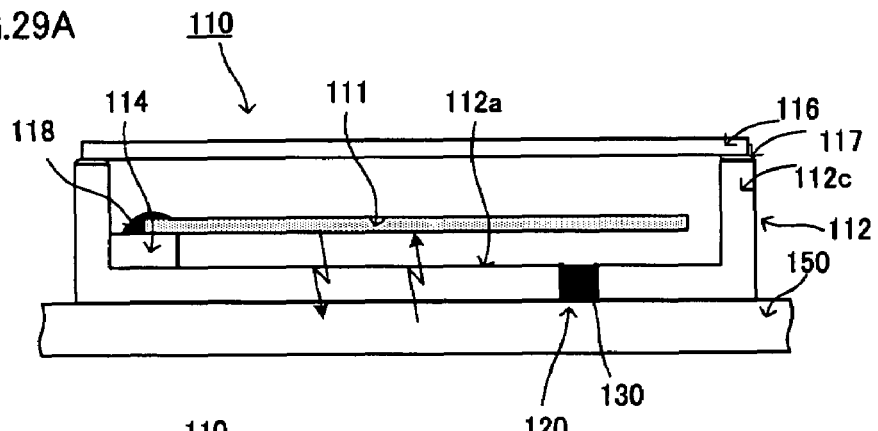
FIG. 29A to FIG. 29D are illustrations to explain an influence of a noise and a state of a sealant when a shielding electrode is provided.
Figure 29B:
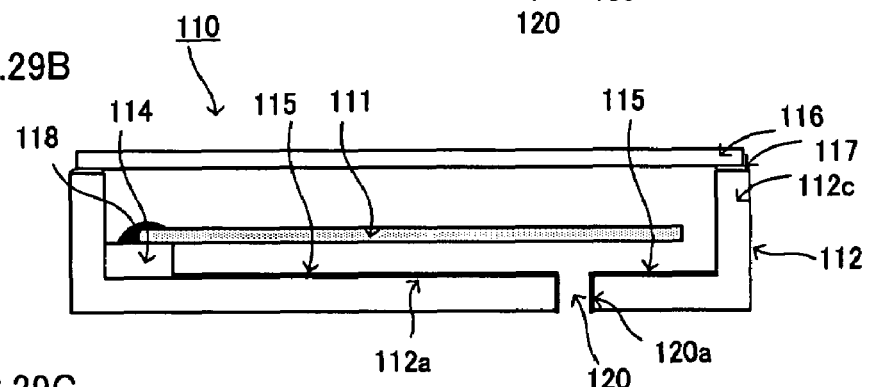
Figure 29C:
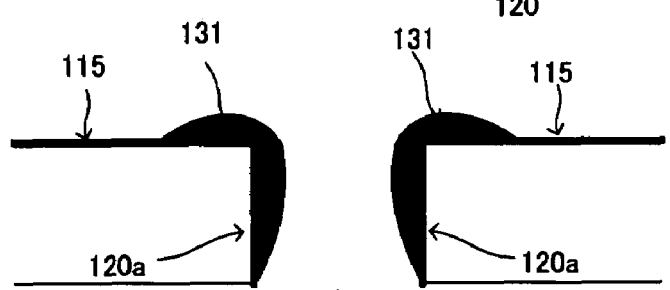
Figure 29D:
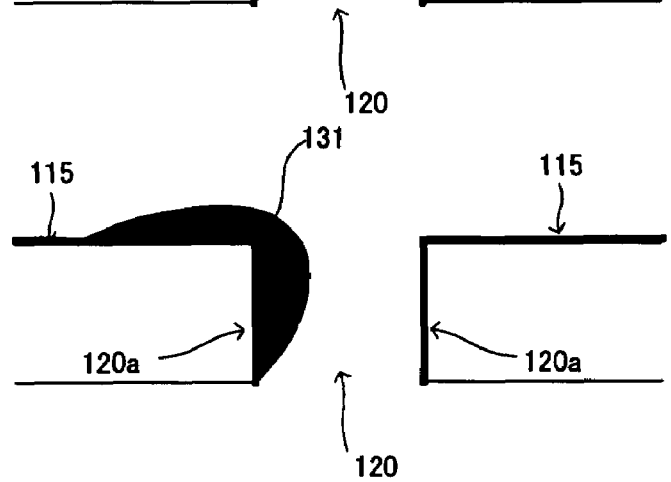
Figure 31:
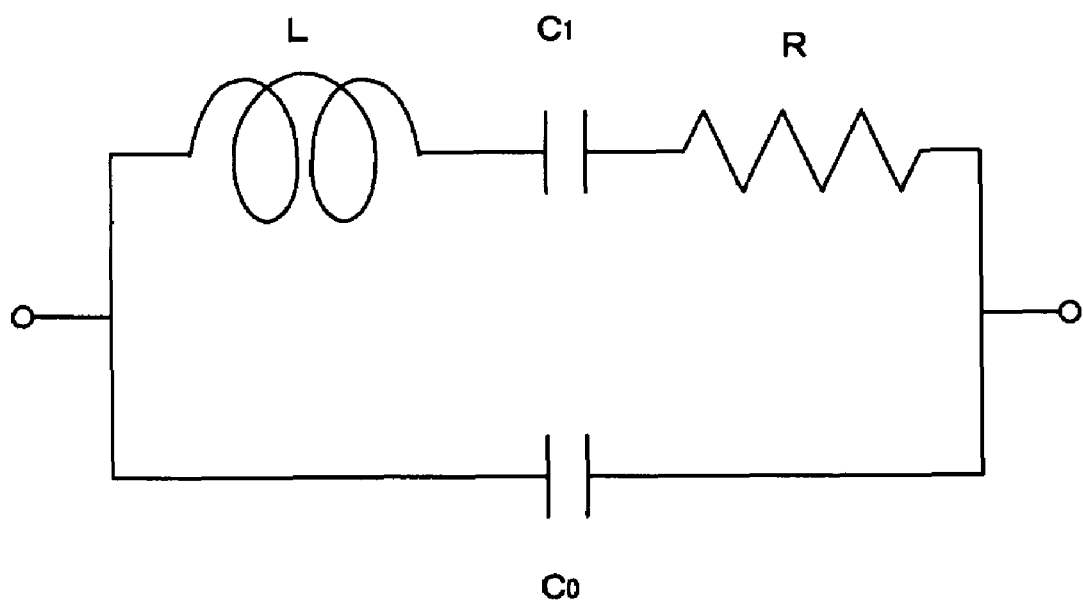
FIG. 31 is an illustration to show an equivalent circuit of an oscillator.

In the pressure regulating step in S10 as described above, a pressure within the case of the electronic component package, in which the piezoelectric oscillator is mounted, is regulated to a predetermined level. According to this pressure regulation, the CI value of the piezoelectric oscillator is regulated. The CI value is one of an evaluation value that is used to evaluate characteristics of the piezoelectric oscillator. There are characteristics as shown in FIG. 24 between the CI value and the vacuum level in the case, indicating that if the degree of vacuum becomes higher (left part of the figure), the CI value becomes lower. It is to be noted that the degree of vacuum in FIG. 24 is expressed by logarithmic scale, though it is not illustrated.

This CI value is an evaluation value relating to a sensitivity of the oscillator, and the CI value has been conventionally required to be lowered so as to obtain a higher sensitivity. Therefore, an effort has been made to reduce the pressure within the case that stores the oscillator.

However, the inventor who has filed the present application has found the followings: If the CI value is too low, there is a problem that it takes time until the drive of the oscillator is stabilized. For the functions as the oscillator, lowering the CI value is not completely recommended, and it is necessary to set the CI value to be within a predetermined value that satisfies both a desired sensitivity and the time length required for stabilization. Furthermore, by regulating the pressure within the case, it is possible to set a predetermined CI value.

When a physical sensor such as an oscillatory gyro sensor and an oscillatory acceleration sensor is configured, which detects a physical quantity applied from the outside, it becomes highly sensitive when the CI value is low, and even a minor change in oscillation can be detected. However, it takes a time until the detection output becomes stable. On the other hand, when the CI value is high, the detection output becomes stable within a short period of time, but detection cannot be carried out following a minor change in vibration.

FIG. 24 schematically illustrates the CI value with respect to the degree of vacuum. In FIG. 24, when "W" is assumed as a width of CI value that satisfies both the sensitivity required for the piezoelectric oscillator and the time length required for stabilization, the CI value can be set within the demanded range by conducting the pressure regulation to make the degree of vacuum within the range "P1", as for the piezoelectric oscillator having a characteristic curve indicated by "C1". As for the piezoelectric oscillator having a characteristic curve indicated by "C2", the CI value can be set within the demanded range by conducting the pressure regulation to make the degree of vacuum within the range "P2".

Therefore, in the pressure regulation step of S10 as described above, a pressure value is obtained, based on the characteristic curve between the degree of vacuum and the CI provided on the piezoelectric oscillator, and the sensitivity and the time length required for stabilization that are necessary for an apparatus using the piezoelectric oscillator, and the pressure regulation is performed with an aim to achieve this obtained pressure value. According to this pressure regulation, it is possible to set the characteristics of the piezoelectric oscillator to desired values.

The electronic component package of the present invention can applied to an oscillatory type gyro sensor, an oscillatory type acceleration sensor, or the like.

What is claimed is:

1. An electronic component package comprising,
   a case that has an opening and stores an electronic component in a storage inside, and a lid that covers the opening, being joined to a rim of the opening, and
   airtightly sealing a through-hole by using a sealant, the through-hole being provided on a bottom of the case and communicating with the outside, wherein,
   a nonmetal part is provided between a shielding electrode placed on an inner surface of the case and a metal coating placed on an inner periphery of the through-hole communicating with the outside, so as to prevent the sealant being melted from flowing.

2. The electronic component package according to claim 1, wherein,
   the case is made of an insulating material,
   the shielding electrode is provided on the inner surface of the case in such a manner as excluding a circular area that has an inner periphery corresponding to the rim of the through-hole on the inner surface of the case side, and
   the nonmetal part is formed by an exposed surface of the case at the circular area.

3. The electronic component package according to either claim 1 or claim 2, wherein,
   the case is made of an insulating material,
   the metal coating is placed on the inner surface excluding a circular area as a part of an axial direction of the through-hole, in the inner surface of the through-hole, and
   the nonmetal part is formed by an exposed surface on the inner surface of the through-hole at the circular area.

4. The electronic component package according to claim 1, wherein,
   the nonmetal part comprises a circular body made of an insulating material, surrounding the through-hole on the shielding electrode placed on the inner surface of the case.

5. The electronic component package according to claim 1, wherein,
   the nonmetal part comprises a cylindrical body made of an insulating material, covering the inner surface of the through-hole, the cylindrical body having an inner diameter identical to the diameter of the through-hole, and being capable of freely inserted into the through-hole.

6. The electronic component package according to claim 1, wherein,
   the nonmetal part comprises,
   a circular body made of an insulating material, surrounding the through-hole on the shielding electrode placed on the inner surface of the case, and
   a cylindrical body made of an insulating material that has an inner diameter identical to the diameter of the through-hole, and circularly covers a part of the inner surface as at least a part of the axial direction of the through-hole.

7. The electronic component package according to either claim 1 or claim 2, wherein,
   the case is made of an insulating material,
   the through-hole has a conical shape having an inclined cross section with a plane at least inclined from the rim of the through-hole on the inner surface of the case side to the midway of the axial direction of the through-hole, the metal coating is placed on the inner periphery surface excluding a circular area as a part of the axial direction of the through-hole on the inner periphery surface of the through-hole, and the nonmetal part is formed by an exposed surface on the inner periphery surface of the through-hole at the circular area.

8. A physical sensor is the electronic component package according to claim 1, comprising a piezoelectric oscillator as an electronic component, and detecting a physical quantity applied from outside.

9. The physical sensor according to claim 8 is an oscillatory type gyro sensor.

\* \* \* \* \*